(12) United States Patent
Fujita et al.

(10) Patent No.: US 11,051,390 B2
(45) Date of Patent: Jun. 29, 2021

(54) FUNCTIONAL MEMBRANE FOR ION BEAM TRANSMISSION, BEAM LINE DEVICE AND FILTER DEVICE EACH HAVING THE SAME, AND METHOD OF ADJUSTING FILTER DEVICE

(71) Applicants: Japan Atomic Energy Agency, Ibaraki (JP); PESCO Co., Ltd., Tokyo (JP)

(72) Inventors: Natsuko Fujita, Toki (JP); Akihiro Matsubara, Toki (JP)

(73) Assignees: Japan Atomic Energy Agency, Ibaraki (JP); PESCO Co., Ltd., Tokyo (JP)

( * ) Notice: Subject to any disclaimer, the term of this patent is extended or adjusted under 35 U.S.C. 154(b) by 0 days.

(21) Appl. No.: 16/496,136

(22) PCT Filed: Mar. 9, 2018

(86) PCT No.: PCT/JP2018/009288
§ 371 (c)(1),
(2) Date: Sep. 20, 2019

(87) PCT Pub. No.: WO2018/173812
PCT Pub. Date: Sep. 27, 2018

(65) Prior Publication Data
US 2020/0029417 A1 Jan. 23, 2020

(30) Foreign Application Priority Data
Mar. 22, 2017 (JP) .............................. JP2017-055416

(51) Int. Cl.
*H01J 37/09* (2006.01)
*H05H 5/06* (2006.01)
(Continued)

(52) U.S. Cl.
CPC ............... *H05H 5/02* (2013.01); *H01J 37/08* (2013.01); *H01J 37/09* (2013.01); *H05H 5/063* (2013.01)

(58) Field of Classification Search
CPC .... H01J 37/09; H01J 37/3178; H01J 49/0054; H01J 37/08; H01L 21/0203;
(Continued)

(56) References Cited

U.S. PATENT DOCUMENTS

| 4,158,141 A | 6/1979 | Seliger et al. |
| 5,518,572 A | 5/1996 | Kinoshita et al. |

(Continued)

FOREIGN PATENT DOCUMENTS

| EP | 0522296 A2 | 1/1993 |
| JP | 55-39694 A | 3/1980 |

(Continued)

OTHER PUBLICATIONS

Notice of Reasons for Refusal dated May 10, 2019, issued in counterpart Japanese application No. 2019-507550, with English translation (6 pages).
(Continued)

*Primary Examiner* — Amy Cohen Johnson
*Assistant Examiner* — Syed M Kaiser
(74) *Attorney, Agent, or Firm* — Westerman, Hattori, Daniels & Adrian, LLP

(57) ABSTRACT

To provide a functional membrane for ion beam transmission capable of enhancing ion beam transmittance and improving beam emittance. A functional membrane for ion beam transmission according to the present invention is used in a beam line device through which an ion beam traveling in one direction passes and has a channel. The axis of the channel is substantially parallel to the travel direction of the ion beam.

15 Claims, 10 Drawing Sheets

(51) Int. Cl.
*H05H 5/02* (2006.01)
*H01J 37/08* (2006.01)

(58) Field of Classification Search
CPC ...... H01L 21/02027; H05H 3/00; H05H 5/02; H05H 5/063
See application file for complete search history.

(56) References Cited

U.S. PATENT DOCUMENTS

| | | | | |
|---|---|---|---|---|
| 8,791,410 | B2* | 7/2014 | Synal | H01J 49/005 250/288 |
| 9,418,817 | B2* | 8/2016 | Aramaki | H01J 37/08 |
| 2003/0034450 | A1* | 2/2003 | Karger | H01J 49/0418 250/288 |
| 2003/0198849 | A1* | 10/2003 | Hampden-Smith | B01J 21/18 429/483 |
| 2004/0046120 | A1* | 3/2004 | Moses | H01J 37/20 250/311 |
| 2006/0289746 | A1* | 12/2006 | Raznikov | G01N 27/622 250/294 |
| 2008/0134959 | A1* | 6/2008 | Kasu | H01L 29/45 117/84 |
| 2010/0255984 | A1* | 10/2010 | Sutter | C01B 32/188 502/185 |
| 2011/0260171 | A1* | 10/2011 | Yamazaki | H01L 21/02565 257/60 |
| 2011/0285283 | A1* | 11/2011 | Heid | H05H 5/02 315/5 |
| 2012/0235036 | A1* | 9/2012 | Hatakeyama | H01J 37/20 250/310 |
| 2013/0207170 | A1* | 8/2013 | Kurokawa | H01L 27/0207 257/296 |
| 2014/0264065 | A1 | 9/2014 | Cruz | |
| 2015/0047079 | A1* | 2/2015 | Kozakai | H01J 37/3002 850/26 |
| 2016/0227639 | A1* | 8/2016 | Kaminer | H05H 3/00 |
| 2016/0339160 | A1* | 11/2016 | Bedworth | A61M 1/1623 |
| 2017/0098535 | A1* | 4/2017 | Ramsey | H01J 49/165 |
| 2017/0303383 | A1* | 10/2017 | Kirkpatrick | H01J 37/32 |
| 2017/0313603 | A1* | 11/2017 | Fraser | C02F 1/008 |
| 2017/0350002 | A1* | 12/2017 | Yamazaki | C23C 14/3414 |
| 2018/0102195 | A1 | 4/2018 | Murakami et al. | |
| 2018/0265972 | A1* | 9/2018 | Firouzdor | C23C 16/045 |
| 2018/0275088 | A1* | 9/2018 | Huff | B01L 3/50273 |
| 2018/0301388 | A1* | 10/2018 | Ikeda | H01L 22/26 |
| 2019/0122850 | A1* | 4/2019 | Krippendorf | H01J 37/3171 |
| 2019/0309436 | A1* | 10/2019 | Shimoyama | C25D 17/00 |

FOREIGN PATENT DOCUMENTS

| | | | |
|---|---|---|---|
| JP | 8-83741 A | 3/1996 | |
| JP | 11-38195 A | 2/1999 | |
| JP | 2014-150028 A | 8/2014 | |
| JP | 2014150028 * | 8/2014 | ............ H01J 49/28 |
| JP | 6086587 B2 | 3/2017 | |
| WO | 2016/167307 A1 | 10/2016 | |

OTHER PUBLICATIONS

International Search Report dated May 22, 2018, issued in counterpart International Application No. PCT/JP2018/009288 (2 pages).
Hellborg, "Electrostatic Accelerators—Fundamentals and Applications", Springer, 2005, chapter 10, pp. 166-191, cited in the specification.
Synal, "Developments in accelerator mass spectrometry," International Journal of Mass Spectrometry 349-350 (2013), pp. 192-202, cited in the specification.
Imai et al., "Equilibrium and non-equilibrium charge-state distributions of 2.0 MeV/u carbon ions passing through carbon foils," Nuclear Instruments and Methods in Physics Research B 354 (2015), pp. 172-176, cited in the specification.
Fujimoto et al., "Ion Beam Engineering, Ion-Solid Interactions", Uchida-Rookakuho, 1995, chapter 4, pp. 97-100, w/ Partial English translation, cited in the specification (11 pages).
Matsuzaki, "Principle of Accelerator Mass Spectrometry", Tokyo University, Journal Vacuum, 2007, vol. 50, No. 7, pp. 467-474, w/ English translation, cited in the specification (24 pages).
Sarkar et al., "Transmission and charge state distribution of carbon ions emerging from nitrogen gas target in a tandem accelerator: Impact of stripper gas pressure", Physical Review Special Topics—Accelerators and Beams, 2012, 15, pp. 100101-1-8, (Paragraph [0047]), (8 pages).
Hajnal et al., "Channeling-like effects due to the macroscopic structure of porous silicon", Nuclear Instruments and Methods in Physics Research B, 1996, 118, pp. 617-621, (Paragraph [0118]), (5 pages).
Extended European Search Report, dated Nov. 13, 2020, issued in counterpart European Patent Application No. 18771662.6 (in English; 10 pages).

* cited by examiner

Travel direction (+z direction) of ion beam in beam line device

Entire configuration

Dimension and arrangement

Change in normalized count with respect to voltage VD to electrostatic deflector Count of $^{10}$Be is 5000 times increased value Shaded circle denotes channeling state, and blank circle denotes non-channeling state in FIG. 16C

FUNCTIONAL MEMBRANE FOR ION BEAM TRANSMISSION, BEAM LINE DEVICE AND FILTER DEVICE EACH HAVING THE SAME, AND METHOD OF ADJUSTING FILTER DEVICE

TECHNICAL FIELD

The present invention relates to a functional membrane for ion beam transmission for improving ion beam transmittance, a beam line device using the functional membrane for ion beam transmission, and a method of adjusting the functional membrane for ion beam transmission.

BACKGROUND ART

Generally, in a device such as an accelerator, an ion beam having an energy of about 1 MeV (several 10 keV) or more can be transmitted through a membrane having a thickness of 1 μm (several 10 nm). Conventional functional membranes for ion beam transmission (hereinafter, referred to also as "FMIT") utilize the transmission phenomenon as a basis.

Examples of the application of the FMIT include a stripper for a tandem accelerator having a charge conversion function, a post stripper having a function of increasing the number of charges in a beam line, and a degrader having an energy attenuation function. The stripper and post stripper are also referred to simply as "stripper". While there is a term called "second stripper", it is used both as the above-mentioned stripper and post stripper. For this reason, this term is not used in the present specification (Non-Patent Documents 1 and 2).

The stripper and post stripper utilize a phenomenon called "electron detachment" occurring when ions pass through a membrane. When ions pass through a membrane, they collide with electrons or atomic nuclei in a solid. The incident ions reach a charge state distribution (i.e., equilibrium charge state distribution) determined by incident energy while repeating electron detachment/capture and excitation/deexcitation. The equilibrium charge at this time is normally higher than the charge of the incident ions, so that the charge of the passing ions is higher on average than the charge of the incident ions (Non-Patent Document 3).

The stripper has a function of converting negative ions entering an accelerator into positive ions and emitting the positive ions. The stripper is typically used for a tandem accelerator. The tandem accelerator has a section called "terminal" at the center between inlet and outlet ports. The terminal is connected to both the inlet and outlet ports through an accelerator tube.

When a positive charge is externally applied to the terminal, a hill-type potential profile in which the electric potential is made highest at the terminal and gradually reduced toward the inlet and outlet ports is formed. The incident negative ions are accelerated toward the terminal with a positive electric potential, and then, at the stripper in the terminal, electrons are stripped off to turn the negative ions into positive ions. The obtained positive ions receive electric repulsion generated between themselves and the terminal with a positive electric potential and are accelerated once again toward the emission port. As described above, the stripper plays an essential role in the mechanism of the tandem accelerator (Non-Patent Document 1).

In accelerator mass spectrometry (hereinafter, referred to as "AMS"), the stripper serves also as a filter for removing molecular interfering with analysis. Specifically, in the AMS, molecules (hereinafter, referred to as "interference molecules") having a mass substantially equal to the mass of the AMS nuclides interfere with detection of the AMS nuclides. The stripper has a function of dissociating the interference molecules (Non-Patent Documents 2 and 5).

The post stripper has a function of increasing the number of charges of the ions accelerated by a tandem accelerator or the like for academic experiments. As a representative example, in experiments required for constructing a physical database useful for heavy ion radiation therapy, i.e., in interaction between ions and a solid, the post stripper adjusts the number of charges of ions entering a solid (Non-Patent Document 4).

The degrader has a function of attenuating the energy of the ions accelerated by a tandem accelerator or the like according to a purpose. As a representative example, in separating the AMS nuclides from interference particles, the degrader makes the AMS nuclides and interference particles incident into a membrane and produces a difference between their energies based on a difference in stopping power. In the AMS, when there exist stable isobars having a mass equal to the mass of the AMS nuclides ($^{15}$B for $^{15}$Be, $^{36}$S for $^{36}$Cl, $^{53}$Cr for $^{53}$Mn, etc.), they become nuclides (hereinafter, referred to as "interference nuclides") interfering with measurement of the AMS nuclides, and separation of these interference nuclides from the AMS nuclides is the main technological issue (Non-Patent Documents 2 and 5). The degrader is generally installed in front of a detector (e.g., a gas ionization chamber) or on a beam line near the detector. A structure obtained by imparting the degrader function to a detector window is referred to as a degrader window in the present specification.

Beam emittance (product of a standard deviation σ of spatial spread of beam and a standard deviation σ' of angular spread thereof) and transmittance are indices of beam quality. In any of the above-described applications of the FMIT, ions undergo an increase in the beam emittance and attenuation of the transmittance occurring due to multiple scattering of ions with atomic nuclei in the membrane.

Conventionally, when high transmittance is prioritized, gas is used in place of a membrane in the stripper. On the other hand, when a high charge state is prioritized, a membrane is preferably used. Conventional approaches have coped with the attenuation of transmittance and increase in emittance due to large-angle scattering occurring in the membrane by installing a beam converging lens downstream of the membrane. However, even when the beam converging lens is used, emittance that has once been deteriorated can be no longer improved (Non-Patent Document 1).

In technological development toward the miniaturization of of an AMS device, it has been considered that gas is inevitably used in the stripper serving also as a filter for removing the interference molecules, in association with lowering of ion energy. This is because when ion energy becomes smaller than 1 MeV, scattering (particularly, elastic scattering with atoms) in an ion transmission membrane becomes prominent to significantly deteriorate both the emittance and transmittance.

A main factor restricting the miniaturization of an AMS device is that it is difficult to achieve both the maintenance of the function of a stripper using gas and the maintenance of high vacuum of a beam line. When the amount of gas injected into the stripper is increased so as to maintain the function of the gas stripper, gas leakage to the beam line is increased. Thus, ions collide with leaking gas particles to be scattered, which may result in high probability of deviation of the trajectory thereof.

Conversely, when the amount of gas in the stripper using gas is reduced, the function of the stripper is lowered. At present, the miniaturization of the AMS device is restricted due to trade-off between the maintenance of the function of the stripper and the maintenance of high vacuum of the beam line. However, when an ion transmission membrane having high ion beam transmittance is present, both the maintenance of the function of the stripper and the maintenance of high vacuum of the beam line can be achieved to remove the restriction on the miniaturization. Thus, development of the FMIT having improved ion beam transmittance may lead to drastic miniaturization of the AMS device.

CITATION LIST

Patent Document

Patent Document 1: Jpn. Patent Application No. 2013-019509
Patent Document 2: Jpn. Patent Application No. 1997-189436
Non-Patent Document 1: "Electrostatic Accelerators—Fundamentals and Applications", R. Hellborg (Editor), Springer, 2005, chapter 10.
Non-Patent Document 2: "Developments in accelerator mass spectrometry", H. A. Synal, International Journal of Mass Spectrometry, 349-350 (2013) 192-202.
Non-Patent Document 3: "Ion Beam Engineering, Ion-Solid Interactions" Fuminori Fujimoto, Kenichiro Komaki, Uchida-Rookakuho, 1995, chapter 4.
Non-Patent Document 4: "Equilibrium and non-equilibrium charge-state distributions of 2.0 MeV/u carbon ions passing through carbon foils", M. Imai and others, Nuclear Instruments and Methods in Physics Research B 354 (2015) 172-176.
Non-Patent Document 5: "Principle of Accelerator Mass Spectrometry", Tokyo University, Hiroyuki Matsuzaki, Journal "Vacuum", Vol. 50, No. 7, (2007), 467-474.

DISCLOSURE OF THE INVENTION

Problems to be Solved by the Invention

As described above, development of a functional membrane for ion beam transmission having high ion beam transmittance has conventionally been required; however, such a functional membrane for ion beam transmission has not yet been developed.

Means for Solving the Problems

To solve the above problem, a functional membrane for ion beam transmission according to the present invention is used in a beam line device through which an ion beam traveling in one direction passes and has a channel, wherein a channel axis is substantially parallel to a travel direction of the ion beam.

The functional membrane for ion beam transmission according to the present invention is made of crystal.

The functional membrane for ion beam transmission according to the present invention is made of a porous substance in which cavities are formed.

A beam line device according to the present invention includes: a vacuum chamber in which an ion beam passes; a functional membrane for ion beam transmission having a channel and disposed in the vacuum chamber; and a positioning stage attached with the functional membrane for ion beam transmission and configured to adjust the position of the functional membrane for ion beam transmission, wherein adjustment is made by the positioning stage such that the functional membrane for ion beam transmission is disposed in the beam line of the ion beam and that a channel axis of the functional membrane for ion beam transmission is substantially parallel to a traveling direction of the ion beam.

In the beam line device according to the present invention, the functional membrane for ion beam transmission is made of crystal, and making adjustment using the positioning stage such that a crystallographic axis of the crystal is substantially parallel to the ion beam travel direction makes the channel axis substantially parallel to the ion beam travel direction.

In the beam line device according to the present invention, the crystal is a single crystal.

In the beam line device according to the present invention, the functional membrane for ion beam transmission is a thin film made of a porous substance in which cavities are formed.

The beam line device according to the present invention is an accelerator.

The beam line device according to the present invention is a stripper.

The beam line device according to the present invention is a degrader.

The beam line device according to the present invention is a gas ionization chamber.

A filter device according to the present invention removes an unwanted particle contained in an ion beam traveling in a vacuum chamber and includes: a vacuum chamber in which an ion beam passes; a functional membrane for ion beam transmission having a channel and disposed in the vacuum chamber; and a positioning stage attached with the functional membrane for ion beam transmission and configured to adjust the position of the functional membrane for ion beam transmission, wherein adjustment is made by the positioning stage such that the functional membrane for ion beam transmission is disposed in the beam line of the ion beam and that a channel axis of the functional membrane for ion beam transmission is substantially parallel to a traveling direction of the ion beam.

In the filter device according to the present invention, the functional membrane for ion beam transmission is made of crystal, and making adjustment using the positioning stage such that a crystallographic axis of the crystal is substantially parallel to the ion beam travel direction makes the channel axis substantially parallel to the ion beam travel direction.

In the filter device according to the present invention, the crystal is a single crystal.

In the filter device according to the present invention, the functional membrane for ion beam transmission is a thin film made of a porous substance in which cavities are formed.

A method for adjusting a filter device according to the present invention is a method for adjusting a filter device including: a vacuum chamber in which an ion beam passes; a functional membrane for ion beam transmission having a channel and disposed in the vacuum chamber; a positioning stage attached with the functional membrane for ion beam transmission and configured to adjust the position of the functional membrane for ion beam transmission; a Faraday cup disposed downstream of the positioning stage and configured to capture the ion beam; and a current measuring part that measures current based on the ion beam captured by the Faraday cup, the method including: a step of adjusting the position of the positioning stage such that the functional membrane for ion beam transmission is disposed in a beam line and that current measured by the current measuring part becomes maximum.

A method for adjusting a filter device is a method for adjusting a filter device including: a vacuum chamber in which an ion beam passes; a functional membrane for ion beam transmission having a channel and disposed in the vacuum chamber; a positioning stage attached with the functional membrane for ion beam transmission and configured to adjust the position of the functional membrane for ion beam transmission; a Faraday cup disposed downstream of the positioning stage and configured to capture the ion beam; and a current measuring part that measures current based on the ion beam captured by the Faraday cup, the method including a first step of adjusting the position of the positioning stage such that the ion beam passes through a position at which the functional membrane for ion beam transmission is absent and that current measured by the current measuring part becomes maximum; and a second step of adjusting, after the first step, the position of the positioning stage such that the functional membrane for ion beam transmission is disposed in a beam line and that current measured by the current measuring part becomes maximum.

The filter device adjustment method according to the present invention includes, after the second step, a third step of making the Faraday cup depart from the beam line.

Specifically, the present invention provides a method that uses a membrane of crystal or the like as an FMIT (Functional Membrane for Ion beam Transmission) and utilizes a phenomenon called "ion channeling transmission (ICT)" occurring when ions are transmitted at a proper incident angle through a membrane of a crystal or the like having a proper thickness to significantly suppress reduction in ion transmittance and increase in emittance due to large-angle scattering while maintaining the function of a stripper or a degrader. A conventional ion transmission membrane is an amorphous membrane and, thus, ICT does not occur. Hereinafter, a situation where ICT does not occur is referred to as "ion random transmission (IRT)".

Advantageous Effects of the Invention

In the beam line device using a functional membrane for ion beam transmission according to the present invention, the filter device using a functional membrane for ion beam transmission, and the method of adjusting the filter device, the crystal plane of the crystal in the functional membrane for ion beam transmission is adjusted so as to be substantially parallel to the travel direction of the ion beam, making it possible to enhance the transmittance of the ion beam and to improve emittance.

BEST MODE FOR CARRYING OUT THE INVENTION

Figure 1:
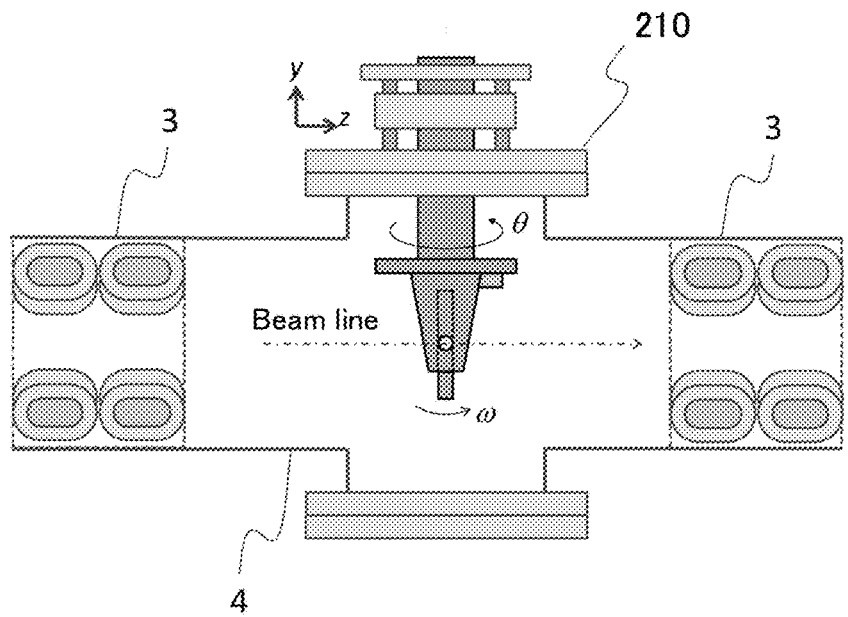
FIG. 1 is a view illustrating a configuration example of a device to which a functional membrane for ion beam transmission according to an embodiment of the present invention is applied.

Hereinafter, embodiments of the present invention will be described with reference to the accompanying drawings. FIG. 1 is a view illustrating a configuration example of a device to which a functional membrane for ion beam transmission according to an embodiment of the present invention is applied. In the device to which the functional membrane for ion beam transmission is applied, an ion beam traveling in one direction passes through a beam line. As the functional membrane for ion beam transmission according to the present invention, a membrane of crystal or the like is used.

In the drawings, the z-direction is a direction in which the ion beam passing inside the device travels. The y-direction is a vertically upward direction, and x-direction is a direction perpendicular to both the y- and z-directions.

A system on which a plurality of the functional membranes for ion beam transmission according to the present invention are mounted is referred to as a multi-membrane system 210, and a system on which a single functional membrane for ion beam transmission according to the present invention is mounted is referred to as a single membrane system 320.

FIG. 1 illustrates a case where the functional membrane for ion beam transmission according to the present invention is applied to a stripper 11 of a tandem accelerator 10. More specifically, FIG. 1 is a schematic view illustrating the essential part of the tandem accelerator 10 illustrated in FIG. 5.

Figure 5:
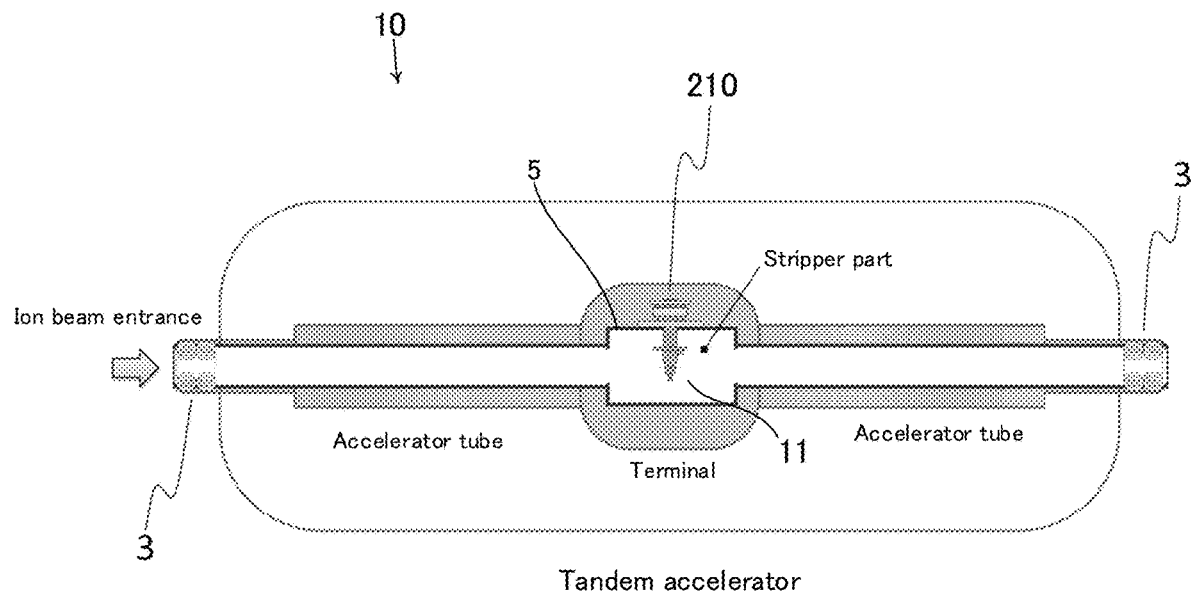
FIG. 5 is a view illustrating an example in which the functional membrane for ion beam transmission according to the embodiment of the present invention is applied to a tandem accelerator 10.

Negative ions generated by a not-shown ion source are introduced into the tandem accelerator 10 and is accelerated toward a terminal 5 as illustrated in FIG. 5. In the terminal 5, the multi-membrane system 210 having a plurality of the functional membranes for ion beam transmission according to the present invention is installed.

In the present invention, ions are made to enter the functional membranes for ion beam transmission of the multi-membrane system 210 (FIG. 3) installed in the terminal 5 to create an ICT (Ion Channeling Transmission) state so as to improve ion transmittance and emittance through suppression of large-angle scattering while maintaining the function of the stripper.

Figure 6:
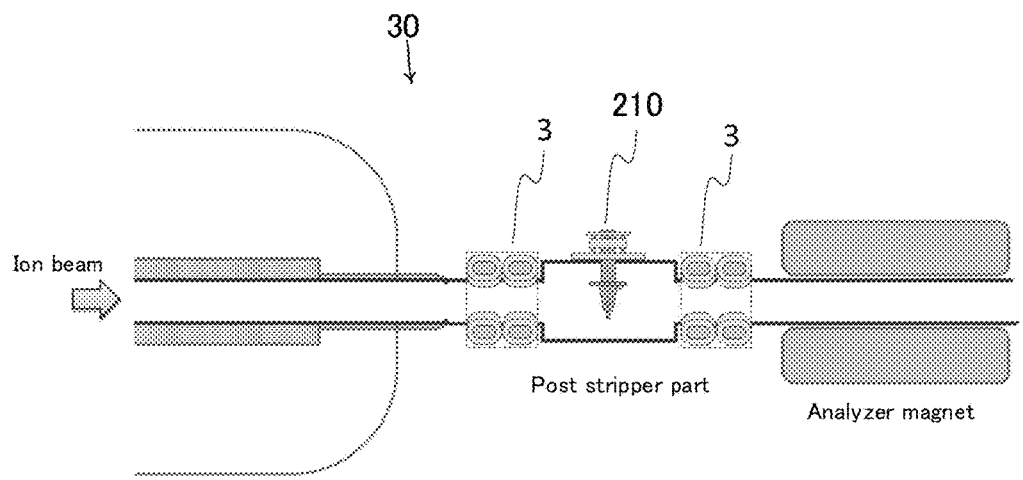
FIG. 6 is a view illustrating an example in which the functional membrane for ion beam transmission according to the embodiment of the present invention is applied to a post stripper 30.

When the functional membrane for ion beam transmission according to the present invention is applied to a post stripper 30, ions accelerated by an accelerator as illustrated in FIG. 6 are guided to a post stripper part and are made to enter the functional membranes for ion beam transmission of the multi-membrane system 210 (FIG. 3) installed therein to create the ICT state so as to improve ion transmittance and emittance through suppression of large-angle scattering while maintaining the function of the stripper.

Figure 7:
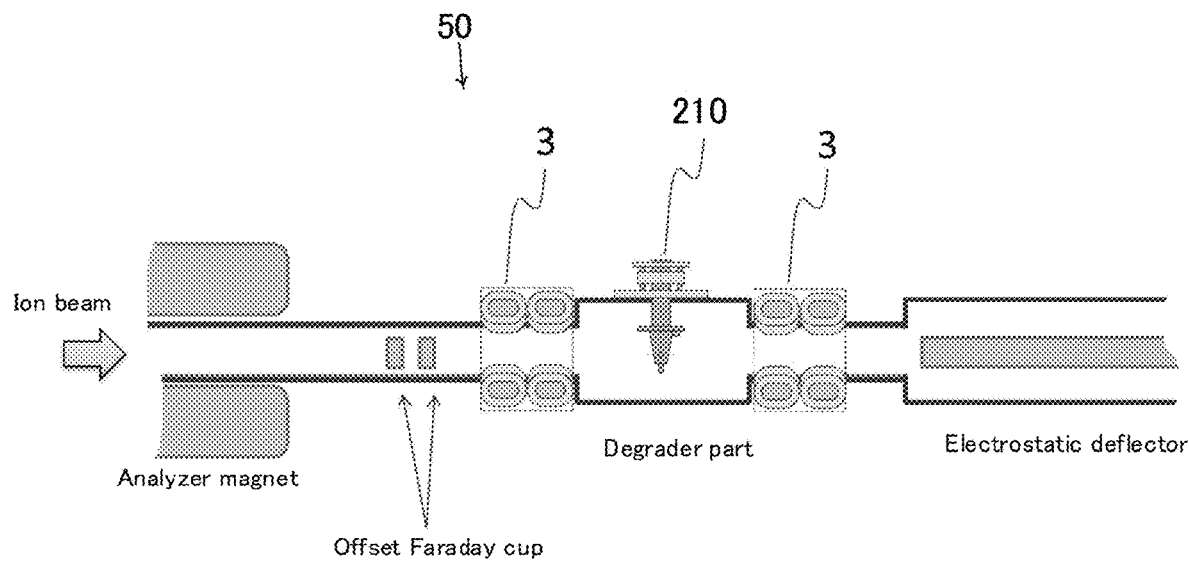
FIG. 7 is a view illustrating an example in which the functional membrane for ion beam transmission according to the embodiment of the present invention is applied to a degrader 50.

When the functional membrane for ion beam transmission according to the present invention is applied to a degrader 50, ions with a charge state selected by means of an analyzer magnet are guided to a degrader part as illustrated in FIG. 7 and are made to enter the functional membranes for ion beam transmission of the multi-membrane system 210 (FIG. 3) installed therein to create the ICT state so as to significantly improve the efficiency of interference nuclide separation in the AMS while maintaining the function of the degrader.

When the functional membrane for ion beam transmission according to the present invention is applied to, e.g., a degrader window, an ion beam is introduced into an incidence window of a gas ionization chamber 70 at the terminal end of an accelerator and is made to enter the functional membrane for ion beam transmission of the single membrane system 320 (FIG. 4) installed therein to create the ICT state so as to improve ion transmittance and emittance of the degrader window while maintaining the function of the degrader.

In the above-described embodiments, the ICT state is created according to the standards (Table 1) of the thickness of a crystal membrane set corresponding to the energy of ions entering the crystal membrane to thereby maintain the function of the functional membrane for ion beam transmission according to the present invention. Table 1 is a numerical table showing ion energy regions that can be used in the present invention and the standards of the thickness of the crystal membrane corresponding to the respective energy regions.

TABLE 1

Energy regions of ions in the present invention and their corresponding standards of thickness of crystal membrane

| Energy regions of incident ions* | Rough indication** of lower limit of FMIT thickness | Rough indication*** of upper limit of FMIT thickness |
|---|---|---|
| 10 keV | 1 nm$^{(1)}$ | 25 nm |
| 100 Kev | Several nm$^{(2)}$ | 80 nm |
| 1 Mev | Several nm$^{(2)}$ | 250 nm |
| 10 Mev | Several 10 nm$^{(3)}$ | 2.5 µm |
| 100 Mev | Several 100 nm$^{(3)}$ | 100 µm |

FMIT is assumed to be Si single crystal membrane.
*Ion nuclide is assumed to be $^{10}$B.
**Thickness with which equilibrium charge state is reached is estimated based on literature values.
***Thickness corresponding to reaching of energy loss during passage through FMIT to 10% of incident energy is calculated using numerical calculation code (SRIM/TRIM)

(as channeling effect, it is assumed that energy loss efficiency is half that in IRT state, that is, the thickness becomes half the numerical value shown in Table 1 in IRT state).
(1) H. A. Synal, et al., Nucl. Instrum. Methods B 294 (2013) 349-352.
(2) M. Sarkar, et al., Phys. Rev. ST Accel. Beams 15 (2012) 100101.
(3) M. Imai, et al., Nucl. Instrum. Methods B 354 (2015) 172-176.

Figure 2:
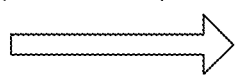
FIG. 2 is a view explaining the principle of the functional membrane for ion beam transmission according to the embodiment of the present invention.
Figure 2:
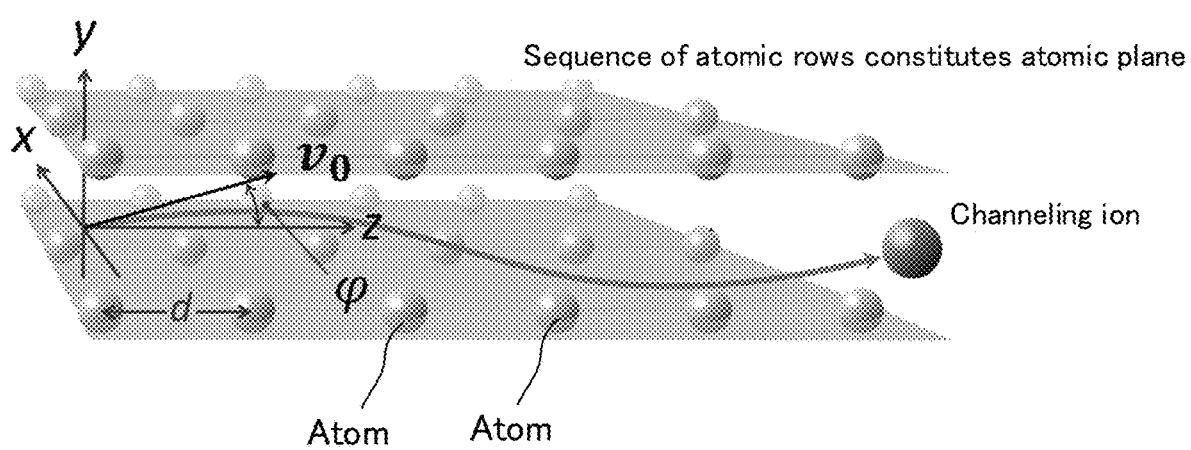

Here, the ICT state is described in detail using FIG. 2. FIG. 2 schematically illustrates ions traveling in a crystal.

Atoms in the crystal are arranged regularly in rows. As viewed in a direction (hereinafter, referred to as the direction of crystallographic axis) along the atomic rows, it can be seen that a large space (hereinafter, referred to as a channel) in which no atom exists expands between the adjacent atomic rows.

Thus, as illustrated in FIG. 2, when ions are made to enter in substantially the direction of crystallographic axis, they travel in the channel while approaching and gently separating (small-angle scattering) from the atomic rows. Such a phenomenon is referred to as ion channeling.

Particularly, channeling along the crystallographic axis is referred to as axial channeling, and channeling along a crystal plane is referred to as planar channeling. The axial channeling can obtain a channeling effect more easily.

Hereinafter, unless otherwise specified, the ICT state refers to a state where ions are transmitted through a membrane of a crystal in the axial channeling. However, the present invention can be achieved by the planar channeling.

Even when the channeling ions collide with a crystal atom, the travel direction thereof is not significantly deviated from the channel (channeling effect). Thus, it is possible to significantly suppress large-angle scattering in the ion transmission membrane by creating the ICT state, leading to improvement in transmittance of the ion transmission membrane and suppression of an increase in emittance. Actually, when the ICT state is created, the transmittance of the ion transmission membrane is increased about ten times or more (Non-Patent Document 3).

The present invention is featured in that the above channeling phenomenon is developed in a membrane of crystal or the like with which an ion beam collides in a beam line device of an ion beam apparatus to realize the functional membrane for ion beam transmission according to the present invention.

More specifically, the functional membrane for ion beam transmission according to the present invention is used in a beam line device through which an ion beam travelling in one direction passes and is made of crystal, wherein the crystal plane of the crystal is parallel to the travel direction of the ion beam. Further, when the crystallographic axis of the crystal is made parallel to the travel direction of the ion beam, the axial channeling can be developed and, thus, a higher effect can be obtained.

According to the thus configured functional membrane for ion beam transmission according to the present invention, it is possible to enhance ion beam transmittance and to improve emittance.

When the thickness of the membrane of crystal or the like is adequate, it is possible to realize the function of the functional membrane for ion beam transmission in the stripper 11, post stripper 30 or degrader 50 even in the ICT state. As described above, in the ICT state, ions travel in the channel while approaching and separating (small-angle scattering) from the atomic rows of crystal. When the ions approach the atomic rows, electrons bound by the ions collide with the atoms of crystal, causing elementary processes including electron loss/capture, ion excitation/deexcitation, and the like. When the thickness of the crystal membrane satisfies the standards of Table 1, the elementary processes are repeated to realize the function of the functional membrane for ion beam transmission even in the ICT state.

The membrane of crystal or the like that can be used as the functional membrane for ion beam transmission according to the present invention may be composed of any elements. Although a polycrystalline material such as SiC can be used as the crystal membrane, a single crystal membrane is advantageous in creating the ICT state due to its large channel width. Further, a single crystal membrane made of silicon (Si) is not only readily available on the market, but also has comparatively high reliability in terms of lattice spacing, which is desirable for creating the ICT state. As the crystal membrane, a Si single crystal membrane has the highest versatility.

Ion nuclide that can enter the membrane of crystal or the like used as the functional membrane for ion beam transmission according to the present invention can be arbitrarily selected.

The standards (see Table 1) of the thickness of the crystal membrane for maintaining the function of the functional membrane for ion beam transmission according to the present invention are set using the following approach and method. The lower limit of the thickness is basically a thickness with which the charge state distribution of incident ions can maintain its equilibrium. When the thickness is increased from a value corresponding to the thickness of one layer of atoms, the charge number of the incident ions is divided into a plurality of charge numbers to form a charge state distribution. When the thickness is further increased, the charge state distribution becomes constant irrespective of the thickness.

The thickness realizing equilibrium can be estimated using the numerical calculation codes (ETACHA code, etc.) used in Non-Patent Document 4. As an example, when a 10 MeV boron (B) beam is made to enter a silicon single crystal, the lower limit of thickness is several ten nm. When the thickness is further reduced, the charge state distribution becomes non-equilibrium state. Thus, high dependency of the average charge on the thickness and an increase in influence of the coherent resonance excitation in Patent Document 1 make the estimation of the charge distribution complicated. Thus, in this case, the function of the functional membrane for ion beam transmission according to the present invention cannot be expected.

On the other hand, the upper limit of the thickness is a thickness with which a state can be maintained where energy that the incident ions lose during passage of the ion transmission membrane is sufficiently small enough to be ignorable in the use purpose of the ion beam. The ions during channeling repeat the elementary processes including electron loss/capture, excitation/deexcitation and the like with the small-angle scattering to gradually lose its energy. The frequency of these elementary processes increases with an increase in the thickness, with the result that not only the energy is reduced, but also a variation in the energy becomes large (increase in energy straggling).

The energy variation is desirably suppressed since it may bring about the loss of the number of ions in deflection/convergence of the ion beam. When the thickness exceeds its upper limit to cause significant energy reduction and variation to a level that does not match the object, it can be no longer said that the function of the functional membrane for ion beam transmission according to the present invention is maintained. The energy reduction and variation corresponding to the thickness can be estimated using a numerical calculation code (SRIM/TRIM, etc.).

Thus, the rough indication of the upper limit of the thickness can be obtained by the numerical calculation code. Table 1 shows energy regions of the ions entering the functional membrane for ion beam transmission specified in the present invention and the upper and lower limits of the thickness corresponding to each of the energy regions. For example, as the upper limit, a thickness corresponding to reaching of energy loss during passage through the functional membrane for ion beam transmission to 10% of incident energy is calculated using the numerical calculation code (SRIM/TRIM). By setting the thickness of the functional membrane for ion beam transmission according to the present invention between the upper and lower limits, the function of the functional membrane for ion beam transmission according to the present invention can be achieved.

In order to create the ICT state, the incident angle of the ions with respect to the crystallographic axis needs to be smaller than an angle called critical angle for channeling. The critical angle $\varphi_c$ can be approximately represented by the following expression.

[Numeral 1]

$$\varphi_c \approx \sqrt{\frac{Z_1 Z_2 e^2}{2\pi \epsilon_o E d}}, \qquad (1)$$

In the above expression, Z1 and Z2 are atomic numbers of the incident ions and ion transmission membrane, respectively, e is elementary electric charge, E is energy of incident ions, and d is atomic spacing between the atomic rows. The critical angle is given by the element and energy of the incident ions and the element of the ion transmission membrane (Non-Patent Document 2) . As an example, when 10 MeV boron (B) is made to enter a silicon single crystal (d=5.4 [Å]), $\varphi_e$ is ±0.49°. In this manner, the standards of the incident angle are predetermined using the critical angle.

In order to create the ICT state with the ion incident angle adjusted within the critical angle for channeling, the membrane system (FIG. 3 or FIG. 4) that supports the ion transmission membrane of crystal or the like is used to precisely adjust angles θ, ω and positions x, y of the membrane by a positioning stage thereof.

In the stripper 11, post stripper 30 and degrader 50, a disk for supporting the membrane of crystal or the like is configured to be movable in vacuum from the aspect of use purpose. Like the multi-membrane system 210 illustrated in FIG. 3, it is preferable that a plurality of membranes of crystal or the like are provided as a spare in an exchangeable manner.

Specifically, a plurality of membrane assemblies 213 (each including membrane 212 and a frame 211) are mounted to a revolver type multi-membrane holder 214 and incorporated into a beam line. When the membrane of crystal or the like is degraded through long-time beam transmission, the multi-membrane holder 214 is sequentially rotated in, e.g., the clockwise direction in the drawing to use an unused crystal membrane.

Figure 3:
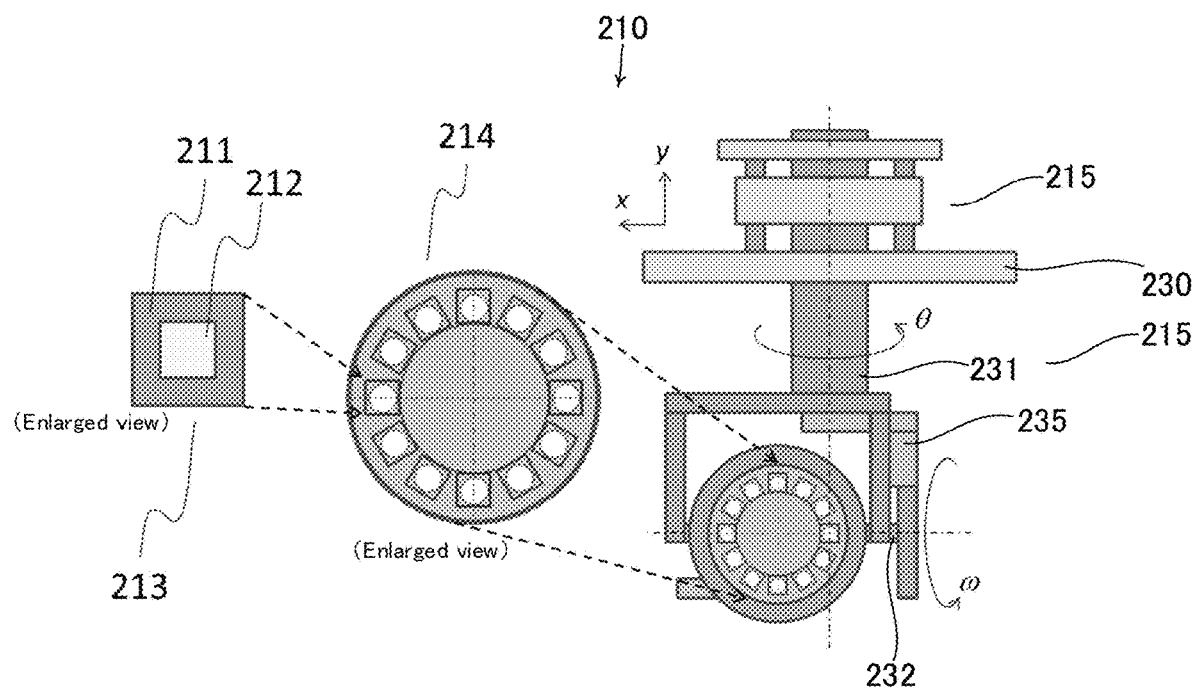
FIG. 3 is a view explaining a multi-membrane system 210 on which a plurality of functional membranes for ion beam transmission according to the embodiment of the present invention are mounted.

In FIG. 3, a multi-membrane positioning stage 215 has a base part 230. A first shaft 231 is rotatable with respect to the base part 230. A frame body 235 is attached to the first shaft 231. When the first shaft 231 is rotated in a ±θ-direction with respect to the base part 230, the frame body 235 is also rotated in the ±θ-direction.

Further, a second shaft 232 is rotatably attached to the frame body 235. The second shaft 232 is attached with the multi-membrane holder 214. When the second shaft 232 is rotated in a ±ω-direction, the multi-membrane holder 214 is also rotated in the ±ω-direction.

The multi-membrane positioning stage 215 as described above is used to adjust the angle and position of a membrane of crystal or the like to thereby create the ICT state, thus obtaining the functional membrane for ion beam transmission according to the present invention. In the stripper 11 and post stripper 30, ion beam intensity is comparatively high, so that degradation of a membrane of crystal or the like comparatively speeds up. Thus, it is important to provide a plurality of spare membranes by which a degraded membrane can be replaced on the spot. Particularly, in the stripper 11 of the tandem accelerator 10, the membrane system needs to be removed manually in an accelerator tank, which requires a large amount of time, so that the importance of the replaceable configuration is more significant.

Figure 4:
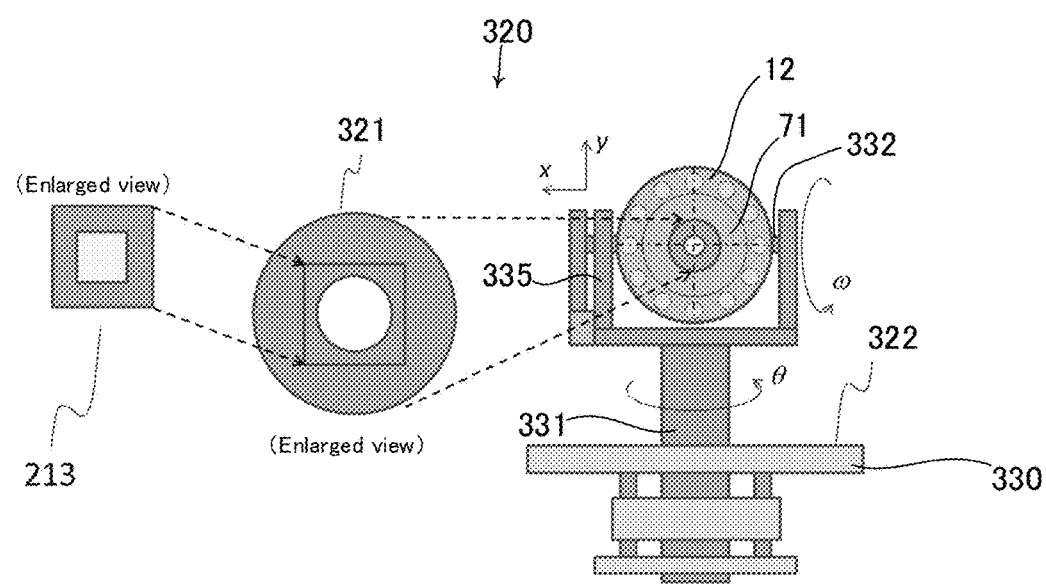
FIG. 4 is a view explaining a single membrane system 320 on which a single functional membrane for ion beam transmission according to the embodiment of the present invention is mounted.

As illustrated in FIG. 4, for a degrader window 71 in the gas ionization chamber 70, a disk itself for supporting a membrane of crystal or the like may serve also as a vacuum flange 12 that contains vacuum, from the aspect of use purpose.

Thus, it is difficult for the membrane system to be provided with membranes of crystal or the like serving as spares due to its structure. It follows that the single membrane system 320 for the degrader window 71 uses a single membrane of crystal or the like. The configuration of the single membrane system 320 is constituted of a membrane assembly 213, a single membrane holder 321 and a single membrane positioning stage 322. In many cases, it is comparatively easy to remove the degrader window 71 from the beam line, and, hence, the necessity of providing such a functional configuration that the degraded membrane is replaced with a spare membrane in-situ is low.

In FIG. 4, the single membrane positioning stage 322 has a base part 330. A first shaft 331 is rotatable with respect to the base part 330. A frame body 335 is attached to the first shaft 331. When the first shaft 331 is rotated in a ±θ-direction with respect to the base part 330, the frame body 335 is also rotated in the ±θ-direction.

Further, a second shaft 332 is rotatably attached to the frame body 335. The second shaft 332 is attached with the single membrane holder 321. When the second shaft 332 is rotated in a ±ω-direction, the single membrane holder 321 is also rotated in the ±ω-direction.

The basic device configuration which is a minimum unit for practicing the present invention is a configuration as illustrated in FIG. 1, in which the membrane system illustrated in FIG. 3 or FIG. 4 is located at the center, and a magnetic quadrupole or electric quadrupole beam converging lenses (hereinafter, referred to merely as "lenses") 3 are arranged along a beam axis.

As described above, it is necessary to adjust the incident angle in order to create the ICT state. To create the ICT state for as many ions in the ion beam as possible, it is important to form a collimated beam before a beam enters a membrane of crystal or the like. The lenses disposed on the downstream side of the membrane system are those for forming the collimated beam. The lenses disposed on the downstream side are used when it is necessary to perform beam convergence according to the use purpose of the ion beam. The downstream side lenses are useful for the stripper 11, post stripper 30 and degrader 50 but have low necessity for the degrader window 71 of the gas ionization chamber 70.

A case where the present invention is applied to the stripper 11 of the tandem accelerator 10 is illustrated in FIG. 5. The multi-membrane system 210 is attached to the terminal 5 of the tandem accelerator 10, and lenses 3 are installed at the entrance and exit of the tandem accelerator 10. The membrane system used here is the multi-membrane system 210 illustrated in FIG. 3. Mass fractionation does not occur in the electric quadrupole lens, so that the electric quadrupole lens is advantageous in, particularly, the AMS where a plurality of isotopes need to be incident in the accelerator substantially simultaneously. The lenses at the entrance are adjusted to form a collimated beam to make the ions enter a membrane of crystal or the like to create the ICT state.

A case where the present invention is applied to the post stripper 30 is illustrated in FIG. 6. The configuration illustrated in FIG. 1 is incorporated, substantially as it is, in a post stripper part. In this case, the multi-membrane system 210 is used. As in the above example, the electric quadrupole lens may be advantageously used as the lenses 3. At any rate, the effect of the lens depends upon the number of charges of ions, so that it is necessary to predetermine the charge number of ion to be made into the ICT-state.

A case where the present invention is applied to the degrader 50 is illustrated in FIG. 7. The configuration illustrated in FIG. 1 is incorporated, substantially as it is, in a degrader part. The degrader 50 is used for an AMS beam line for rare nuclides, i.e., a beam line where a plurality of isotopes are not mixed, thus allowing a comparatively easy-to-handle magnetic quadrupole lens to be used. An example in which the degrader is used in the AMS will be described later.

Figure 8:
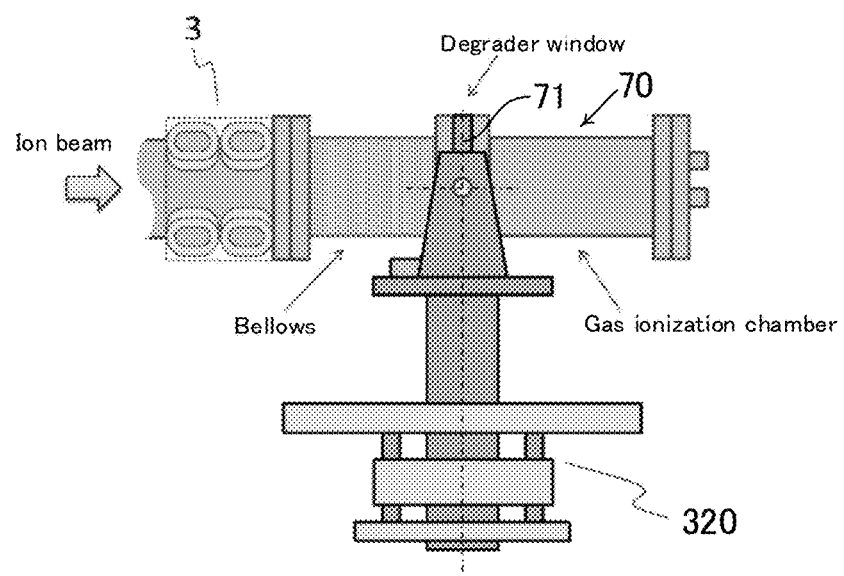
FIG. 8 is a view illustrating an example in which the functional membrane for ion beam transmission according to the embodiment of the present invention is applied to a gas ionization chamber 70.

A case where the present invention is applied to the degrader window 71 of the gas ionization chamber 70 is illustrated in FIG. 8. The basic configuration of the gas ionization chamber 70 is constituted of the single membrane system 320 and lenses 3 on the upstream side of the ion beam. When the position and angle of a membrane of crystal or the like are adjusted by the single membrane system 320, they are moved together with the gas ionization chamber 70. Dynamic distortion generated between the gas ionization chamber 70 and an upstream side vacuum vessel is absorbed by a bellows.

EXAMPLE 1

Figure 9:
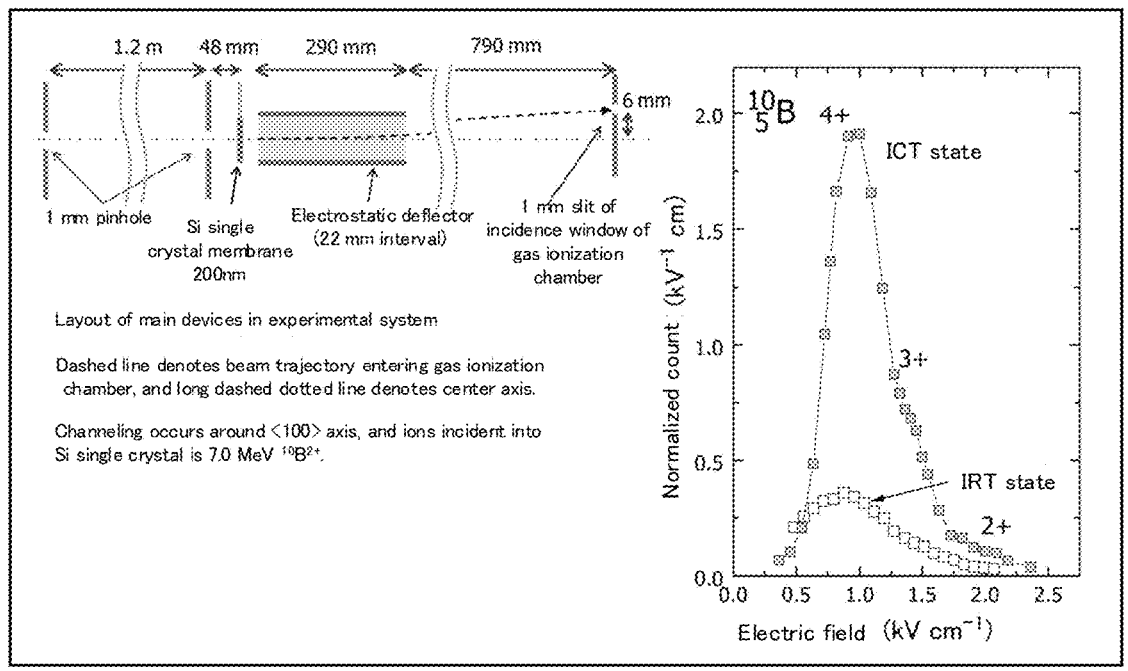
FIG. 9 is a view illustrating an example of an ICT state of the functional membrane for ion beam transmission according to the embodiment of the present invention.

An example creating the ICT state is illustrated in FIG. 9. In the present example, an experimental system on the left side of the drawing was used to make 7.0 MeV $^{10}B^{2+}$ pass through a pinhole and enter a Si crystal membrane. The yield of ions transmitted through the crystal membrane in the gas ionization chamber was measured in each of the ICT and IRT states while the ions were sorted by an electrostatic deflector, and a charge state distribution was calculated from the measurement result. The thickness (200 nm) of the Si crystal membrane satisfies the standards of the thickness shown in Table 1, and thus the function of the functional membrane for ion beam transmission according to the present invention is guaranteed to be achieved. Actually, the average charge number calculated from FIG. 9 is about 4.0 which is equal to the literature value. That is, the charge state distribution reaches equilibrium, which proves that the function of the functional membrane for ion beam transmission according to the present invention is achieved. The figure shows that the ions transmitting the membrane with a charge number 4+ in the ICT state mounts to six times as large as the number of ions transmitting the membrane in the IRT state. This proves that the large-angle scattering of ions in the functional membrane for ion beam transmission according to the present invention is significantly reduced more in the ICT state than in the IRT state. Thus, it becomes clear that the transmittance and emittance of the functional membrane for ion beam transmission are significantly improved while maintaining the function thereof.

EXAMPLE 2

Figure 10:
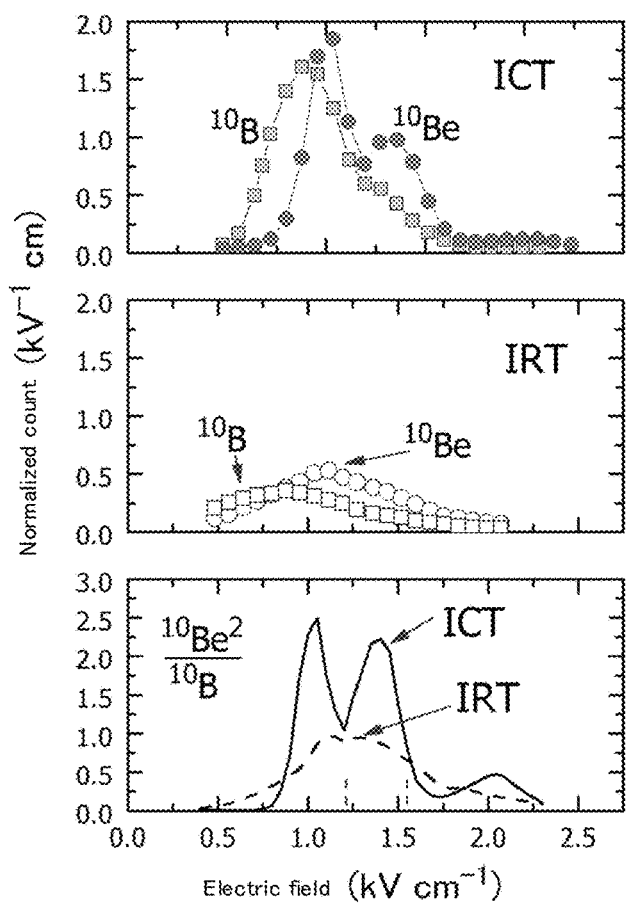
FIG. 10 is a view explaining an example of an effect of enhancement in interference nuclide separation performance in AMS by the functional membrane for ion beam transmission according to the embodiment of the present invention.

An example in which the present invention is applied to the degrader 50 for AMS is illustrated in FIG. 10. As described above, in the AMS, when there exist stable isobars having a mass equal to the mass of the AMS nuclides ($^{10}B$ for $^{10}Be$, $^{36}S$ for $^{36}Cl$, $^{53}Cr$ for $^{53}Mn$, etc.), they become nuclides (interference nuclides) interfering with measurement of the AMS nuclides, and separation of these interference nuclides from the AMS nuclides is the main technological issue.

The degrader 50 is used in the following manner as one separation technique. When both the AMS nuclides and interference nuclides are made to enter the membrane, the energy of one of the AMS nuclides and interference nuclides is lost comparatively significantly, because of the atomic number dependency of stopping power, with the result that energy difference occurs between them. Thus, the AMS nuclides and interference nuclides are separated based on the difference by an energy analyzer provided at the rear stage.

FIG. 10 illustrates an example of isobar separation in the ICT state (functional membrane for ion beam transmission according to the present invention is used) and in the IRT state by the degrader 50. In this example, $^{10}Be$ and $^{10}B$ are assigned as the AMS nuclide and isobar, respectively. The present example is obtained by using the experimental system illustrated in FIG. 9. However, the actual incident ions are not $^{10}Be^{2+}$ but $^{9}Be^{2+}$ which is stable isotope thereof. Thus, correction is made in a theorical manner such that the horizontal axis (electric field) of obtained $^{9}Be^{2+}$ charge state distribution is multiplied by a coefficient so as to be the charge state distribution of $^{10}Be^{2+}$.

As illustrated in FIG. 10, the charge state distribution of $^{10}B$ has a count peak on the lower electric field side than that in the charge state distribution of $^{10}Be$. This is due to a fact that energy loss in the crystal membrane is larger in $^{10}B$ since the atomic number of $^{10}B$ is larger by one than that of $^{10}Be$. That is, the energy of ions incident into the gas ionization chamber is slightly low in $^{10}B$ than in $^{10}Be$. As can be seen in FIG. 10, in an electric field range of 1.0 kV/cm to 1.5 kV/cm, the the count of $^{10}Be$ is larger than the count of $^{10}B$ in both the ICT and IRT states. That is, the efficiency of isobar separation is high in this electric field range. To numerically evaluate the difference between the ICT and IRT states, the effect of the degrader 50 is specified as follows:

(1) How much the counting rate of B is suppressed as compared to the counting rate of Be.

(2) How much counting rate of Be itself is obtained. As an index for (1), Be/B can be used, and it becomes advantageous as the Be/B is get larger. As an index for (2), the count itself of Be can be used. Actually, a higher effect can be obtained when both the above (1) and (2) are increased, so that $Be^2/Be$ can be used as an index obtained by multiplying both the (1) and (2). In the lowest graph of FIG. 10, the two states of ICT and IRT are compared in terms of this index. It can be seen from this graph that the effect of the degrader is higher by about 2.6 times in the ICT state than in the IRT state. That is, the count of Be of the index for (2) is significantly larger in the ICT state and, correspondingly, the effect of the degrader 50 becomes higher, although the difference between the two states is not large in terms of the Be/B of the index for (1).

As described above, it is possible to improve, by several times or more, the transmittance of the functional membrane for ion beam transmission according to the present invention while maintaining the function thereof and to improve, by several times or more, the effect of the degrader using the functional membrane for ion beam transmission according to the present invention in the AMS. This leads to enhancement in measurement precision in the AMS, as well as, miniaturization of an accelerator and improvement in accelerator working efficiency. In particular, when the functional membrane for ion beam transmission according to the present invention is applied to the stripper, both the maintenance of the function of the stripper and the maintenance of high vacuum of the beam line can be achieved even when low energy ions of about 100 keV which is the criteria of miniaturization in the AMS device are used, leading to drastic miniaturization of the AMS device.

As described above, the functional membrane for ion beam transmission according to the present invention and the method of adjusting the functional membrane for ion beam transmission are used in a beam line device through which an ion beam traveling in one direction passes. The functional membrane for ion beam transmission according to the present invention is made of crystal, and the crystal plane of the crystal is parallel to the travel direction of the ion beam. Thus, in various devices, the functional membrane for ion beam transmission according to the present invention allows enhancement in ion beam transmittance and improvement in emittance.

Further, the significant improvement in the ion transmittance and emittance of the functional membrane for ion beam transmission according to the present invention in the ICT state produces the following effects (a) and (b).

(a) Attenuation of the intensity of the ion beam after being transmitted through the stripper and the post stripper is suppressed, so that all works, analyses and measurements involved with the use of the accelerator are improved in efficiency.

(b) In the AMS, the interference nuclide separation performance of the degrader is enhanced, so that analytical precision can be improved. When the present invention is applied to the degrader serving also as an incidence window of the gas ionization chamber, scattering of ions in the window significantly decreases to increase the number of ions entering an ion detection area of the gas ionization chamber, with the result that the peak profile of energy spectrum obtained from the gas ionization chamber becomes sharp. This also leads to enhancement in the interference nuclide separation performance.

(c) Particularly, when the present invention is applied to the stripper, both the maintenance of the function of the stripper and the maintenance of high vacuum of the beam line can be achieved even when low energy ions of about several tens keV to 100 keV which is the criteria of miniaturization in the AMS device are used. This solves a conventional problem, being an obstacle in technical development toward the miniaturization of the AMS device, that gas leakage to the beam line increases to increase the interference nuclides when the function of the stripper using gas is attempted to be maintained. Thus, the present invention leads to drastic miniaturization of the AMS device.

The following describes a concrete configuration of a small AMS system which is a type of the beam line device using the functional membrane for ion beam transmission according to the present invention. The small AMS system is configured to count an extremely small number of isotopes contained in a sample by an accelerator mass spectrometry method to measure an isotope ratio in the sample. As a distinct feature, the small AMS system according to the present invention uses the functional membrane for ion beam transmission as a means for removing unwanted molecules interfering with mass spectrometry to reduce the size thereof as compared to conventional accelerators. The above unwanted particle removal means used in the small AMS according to the present invention is hereinafter referred to as a filter device.

While the character "A" included in "small AMS system" is an abbreviation of "Accelerator", the team "small AMS system" used in the present specification does not include a configuration corresponding to a generally recognized accelerator or accelerating device. However, a configuration for accelerating ions is included in a lead-out electrode part (not illustrated) of a negative ion source 510 in the "small AMS system" according to the present specification. The "small AMS system" according to the present specification is a concept included in the beam line device. Thus, the "small AMS system" according to the present specification can also be defined as a device capable of performing ion spectrometry without involving acceleration of ions taken out from the negative ion source 510 in an accelerator or accelerating device. The "small" of the "small AMS system" means that there is no need to use the accelerator or accelerating device to allow miniaturization of the device configuration.

The small AMS system according to the present invention is a system from which the tandem accelerator is removed and that handles ion energy of about 50 keV. In the accelerator, adoption of a gas stripper has been considered as the function of performing charge conversion and removal of interference molecules (unwanted molecules unnecessary for analysis) for the ion energy of about 50 keV. However, when the ion energy becomes low, the amount of gas for maintaining the function of the gas stripper is increased in order to increase a probability of stripping electrons off from the ions. It follows that the gas pressure in the beam line increases to increase ion scattering frequency, thus making measurement limit worse. That is, application of a gas stripper used in the tandem accelerator to the small AMS system makes it difficult to achieve both the maintenance of interference molecule removal function and the maintenance of measurement limit.

Figure 11:
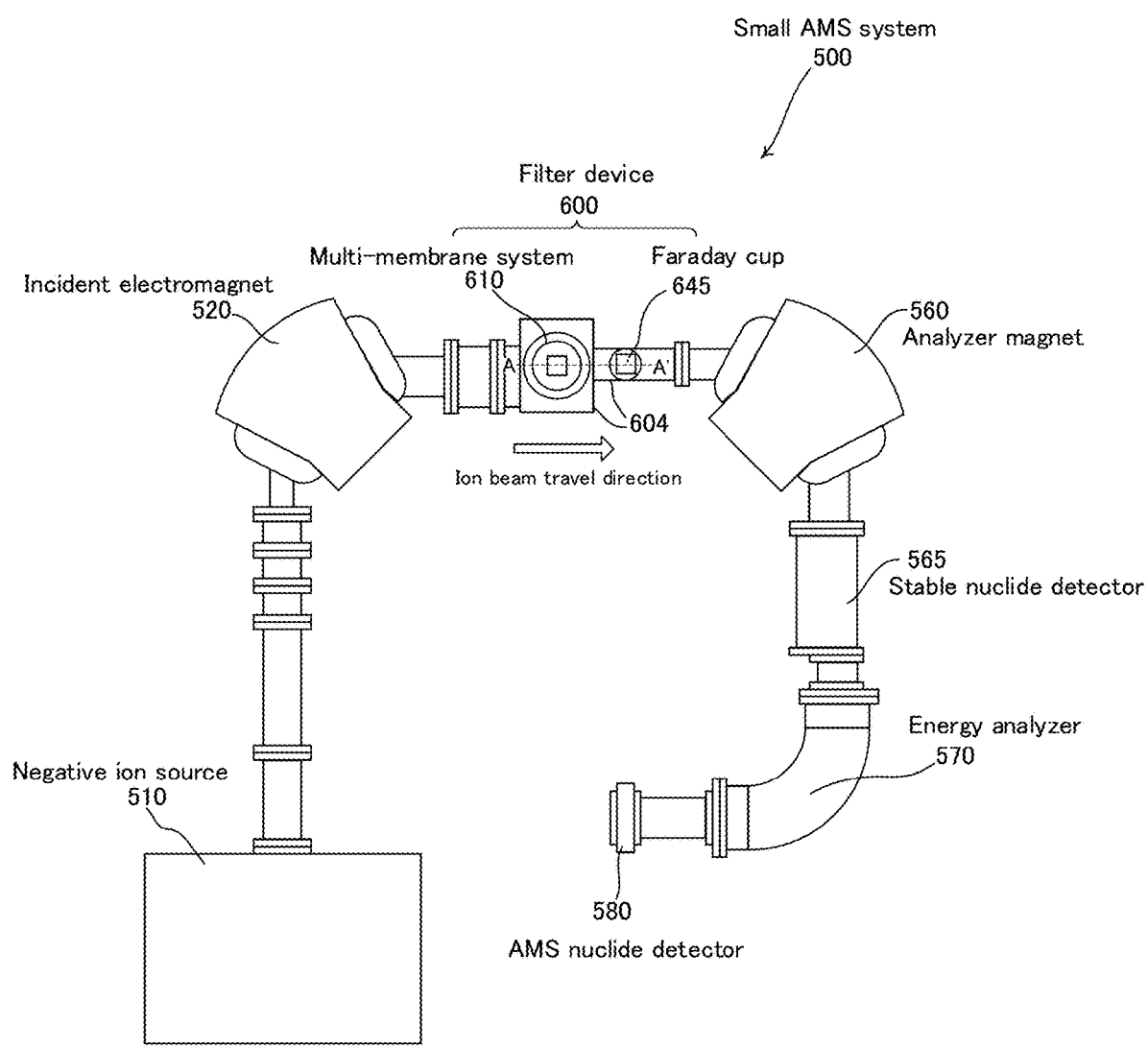
FIG. 11 is a schematic view explaining the configuration of a small AMS system 500 according to an embodiment of the present invention.

Thus, a small AMS system 500 according to the present invention uses a filter device 600 functioning as the removal means of the interference molecules (unwanted molecules) by using a solid in place of gas. Like the stripper, the filter device 600 functions to strip off electrons of the interference molecules (unwanted molecules) to promote dissociation of molecules. FIG. 11 is a schematic view illustrating the configuration of the small AMS system 500 according to the present invention in a bird's-eye manner.

The small AMS system 500 according to the present invention mainly includes, in the order from the upstream side in the ion beam travel direction, a negative ion source 510, an incident electromagnet 520, a filter device 600, an analyzer magnet 560, a stable nuclide detector 565, an energy analyzer 570, and an AMS nuclide detector 580. The above components are connected to one another by vacuum piping.

In a conventional tandem accelerator, a gas stripper is disposed in the position of the filter device 600 (see U.S. Pat. Publication No. 8,791,410). On the other hand, in the small AMS system 500 according to the present invention, the filter device 600 is disposed in place of the gas stripper so as to dissociate interference molecules having a mass substantially equal to the mass of the AMS nuclides for preparation of removal thereof.

The filter device 600 roughly includes a multi-membrane system 610 (or a single membrane system), a Faraday cup 645 and a vacuum chamber 604 containing the above components. When crystal used in the membrane system is vulnerable to the ion beam and thus a high replacement frequency is expected, the multi-membrane system 610 is preferably used as the membrane system. As crystal used in the membrane system, a single crystal or polycrystal membrane, or a membrane (referred to as "porous membrane" in the present specification) made of a porous substance having a configuration in which cavities are formed in a crystal membrane or an amorphous membrane may be used.

A substance that can be used for the functional membrane for ion beam transmission according to the present invention can be said to a substance having a channel (ion passage constituting the beam line). The ion passage in the substance having the channel can be referred to as "channel". Examples of a substance having such a channel include single crystal, polycrystal and a porous substance having a configuration in which cavities are formed in a crystal membrane or an amorphous membrane.

When a substance having the channel is crystal, an axis parallel to the crystal plane of the crystal or an axis parallel to the crystallographic axis of the crystal can be referred to as a channel axis. When a substance having the channel is the porous substance, assuming that the cavities formed in the porous substance each have a substantially columnar shape, an axis parallel to the columnar axis of the column can be referred to as a channel axis.

In the crystalline porous substance, when the roughness of the surface of the cavity inner space is set to a less than nm scale, and an ion incident angle is set to a less than a channeling critical angle, surface channeling becomes prominent, and thus scattering on the surface is mainly specular reflection. Thus, in this case, as compared to a porous substance having a configuration in which cavities are formed in an amorphous membrane, large-angle scattering of ions is suppressed to easily enhance beam transmittance. However, restriction on the surface roughness is relaxed in the latter substance, constraint on the manufacture is reduced as compared to the former porous substance.

In the beam line device, filter device and the like using the functional membrane for ion beam transmission according to the present invention, a beam line traveling in one direction is adjusted so as to pass through the channel that the functional membrane for ion beam transmission has.

Figure 12:
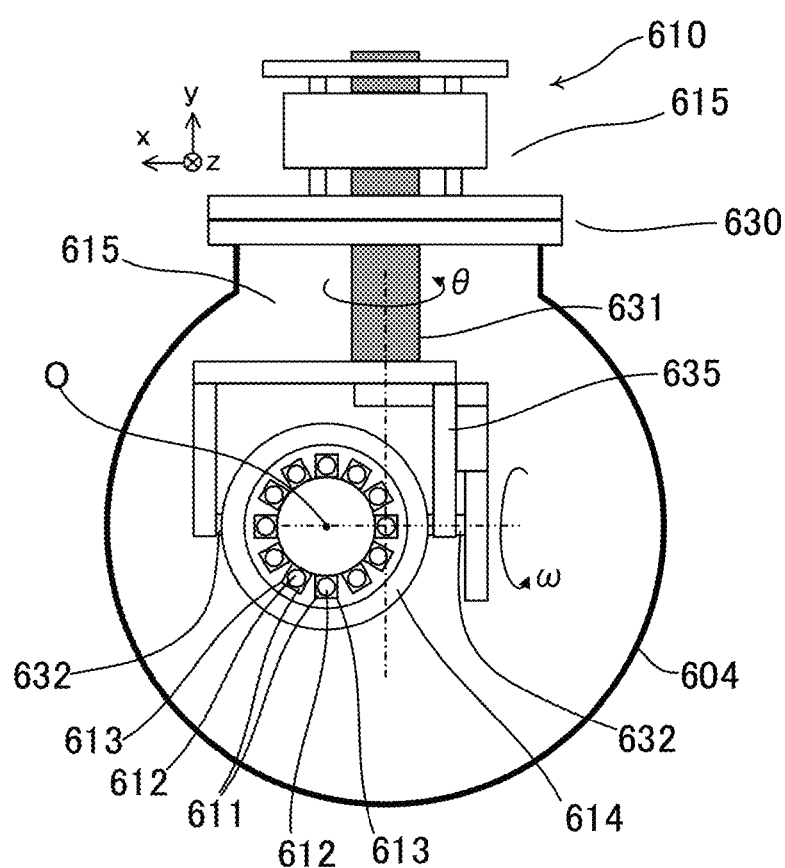
FIG. 12 is a view explaining the configuration of a multi-membrane system 610 constituting a filter device 600 according to an embodiment of the present invention.
Figure 13:
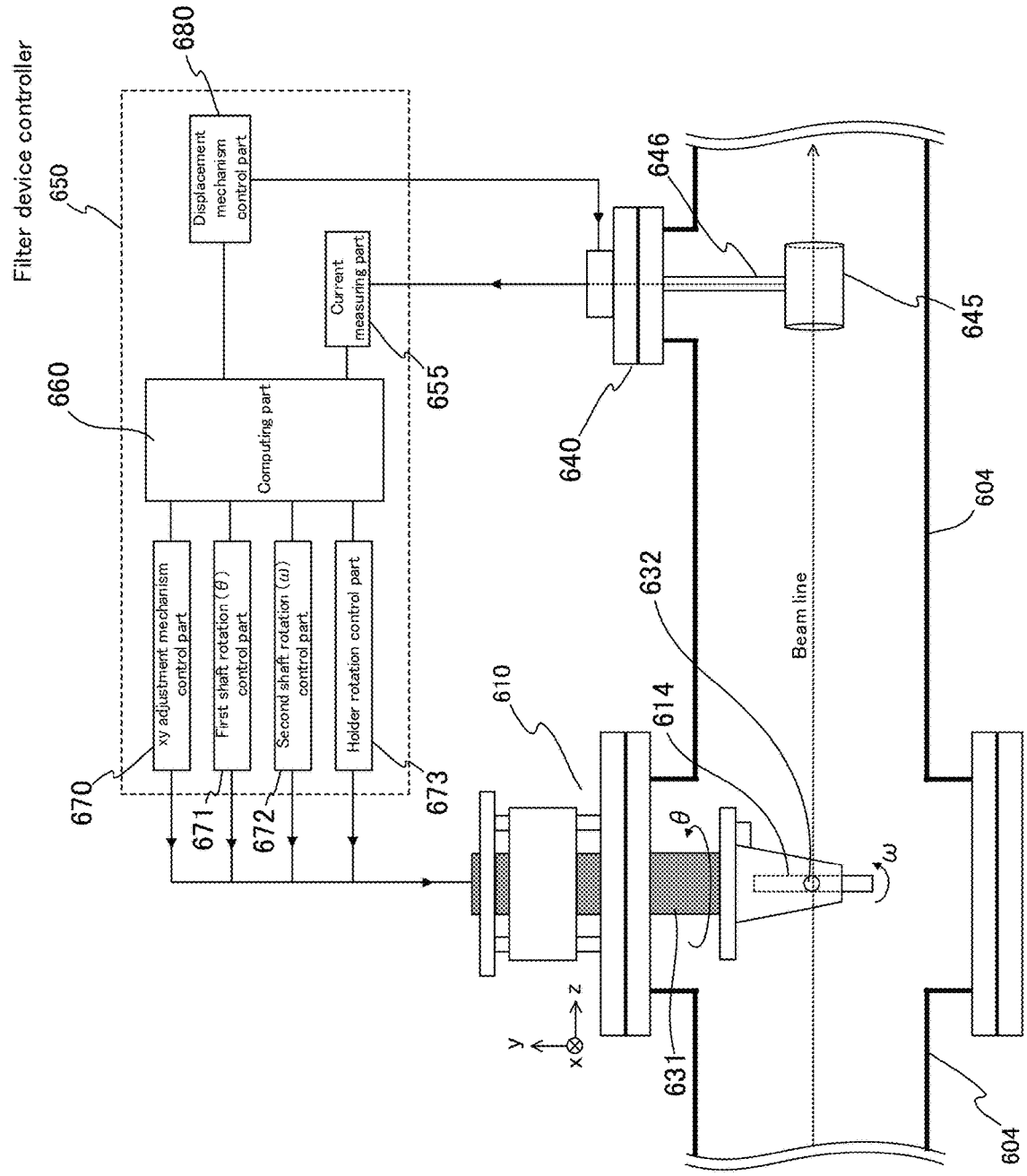
FIG. 13 is a view illustrating the filter device 600 according to the embodiment of the present invention and a filter device controller 650 that controls the filter device 600.

Hereinafter, the filter device 600 according to the present invention used in the small AMS system 500 will be described in more detail. FIG. 12 is a view illustrating the configuration of the multi-membrane system 610 constituting the filter device 600 according to an embodiment of the present invention as viewed in the ion beam travel direction. FIG. 13 is a view illustrating the filter device 600 according to the embodiment of the present invention and a filter device controller 650 that controls the filter device 600.

In FIG. 13, the configuration of the filter device 600 is shown in a cross-sectional view taken along line A-A'.

In the multi-membrane system 610 constituting the filter device 600, a disk-shaped multi-membrane holder 614 that supports crystal (membrane of crystal or the like or membrane of the porous substance) is configured to be movable in vacuum by a not-shown drive means. Preferably, the multi-membrane system 610 has a plurality of crystals as spares and has a replacing function for the crystal through which the beam line passes without opening the vacuum chamber 604.

The revolver type multi-membrane holder 614 configured to be rotated about the center O is mounted with a plurality of membrane assemblies 613 (each including a crystal 612 and a frame 611 holding the crystal 612) and incorporated inside the vacuum chamber 604. In the multi-membrane system 610, an ion beam is transmitted through one of the plurality of crystals 612 held in the multi-membrane holder 614. When the crystal 612 is degraded through long-time beam transmission, the multi-membrane holder 614 is sequentially rotated with an axis passing the center O and being perpendicular to the paper surface as the rotation axis to use an unused crystal membrane.

A computing part 660 provided in the filter device controller 650 that controls the filter device 600 can be constituted of a CPU that executes computing, a RAM which is a rewritable storage means serving as a work area for the CPU, a ROM which is a non-volatile storage means in which a basic program is written, a flash memory which is a rewritable and non-volatile memory, and a microcomputer having an input/output part as an interface means.

A holder rotation control part 673 can communicate with the above computing part 660 and controls the rotation of the multi-membrane holder 614 in the multi-membrane system 610 based on an instruction from the computing part 660.

A multi-membrane positioning stage 615 has a base part 630 and a first shaft 631 through which the base part 630 is inserted. The first shaft 631 can be rotated in the θ-direction about the long dashed dotted line with respect to the base part 630 by a not-shown drive mechanism. The first shaft 631 is attached with a frame body 635 and, when the first shaft 631 is rotated in the ±θ-direction with respect to the base part 630, the frame body 635 can also be rotated in the ±θ-direction. A first shaft rotation control part 671 can communicate with the computing part 660 and controls the rotation of the first shaft 631 based on an instruction from the computing part 660.

The frame body 635 is attached with a second shaft 632. The second shaft 632 can be rotated in the ω-direction about the long dashed double-dotted line with respect to the frame body 635. The second shaft 632 is rotated by a not-shown drive mechanism. The second shaft 632 is attached with the multi-membrane holder 614 and, when the second shaft 632 is rotated in the ±ω-direction, the multi-membrane holder 614 can also be rotated in the ±ω-direction. A second shaft rotation control part 672 can communicate with the computing part 660 and controls the rotation of the second shaft 632 based on an instruction from the computing part 660.

In FIG. 12, the intersection between the long dashed dotted line and the long dashed double-dotted line is assumed to be a point at which the beam line passes.

Further, the above first shaft 631 is displaceable in the x- and y-directions with respect to the base part 630 by an xy adjustment mechanism (not illustrated). An xy adjustment mechanism control part 670 can communicate with the computing part 660 and controls the displacement of the xy adjustment mechanism based on an instruction from the computing part 660.

The multi-membrane positioning stage 615 includes all the above-described components, such as the xy adjustment mechanism (not illustrated) for positioning the crystal 612 in the frame 611, the first shaft 631, the second shaft 632 and the multi-membrane holder 614.

The Faraday cup 645 that captures an ion beam is disposed downstream of the multi-membrane positioning stage 615. In the present specification, the source side of the ion beam is defined as the upstream side. Current flows in accordance with the number of ions captured by the Faraday cup 645 and the number of charges of the ions, and this current is measured by a current measuring part 655. The current data measured by the current measuring part 655 is transmitted to the computing part 660, and the computing part 660 applies computing processing to the current data.

A base part 640 is provided at a part of the vacuum chamber 604 and has a Faraday cup support member 646. The Faraday cup 645 is attached to the end portion of the Faraday cup support member 646 and is configured to be displaceable by a not-shown displacement mechanism. A displacement mechanism control part 680 that controls the displacement mechanism (not illustrated) for the Faraday cup 645 can communicate with the computing part 660 and controls the displacement of the Faraday cup 645 based on an instruction from the computing part 660. The displacement of the Faraday cup 645 by control from the displacement mechanism control part 680 allows switching between a layout where the Faraday cup 645 is disposed in the beam line so as to capture an ion beam and a layout where the Faraday cup 645 is made to depart from the beam line so as not to capture an ion beam.

The following describes the crystal to be mounted on the multi-membrane system 610 of the filter device 600 according to the present invention. As described above, as the crystal to be mounted on the multi-membrane system 610, a single crystal or polycrystal membrane, or a membrane (porous membrane) made of a porous substance having a configuration in which cavities are famed in a crystal membrane or an amorphous membrane may be used.

In analysis performed in the small AMS system 500 according to the present invention, which one of a normal crystal membrane and a porous membrane having cavities is selected is determined in consideration of cost and a current value (heat load) from the ion beam.

When the time-averaged current of the ion beam incident into a crystal to be mounted on the multi-membrane system 610 largely exceeds 1 nA to 10 nA, the porous membrane is preferably selected. A crystal membrane (e.g., crystal silicon) having a film thickness of 20 nm to 30 nm suitable for ions having ion energy of about 50 keV cannot withstand a heat load of time-averaged current 1 μA which is often used in carbon measurement. The porous membrane can withstand such a heat load.

Next, differences between the crystal membrane and the porous membrane will be described.

(Crystal Membrane)

The crystal membrane for the membrane system needs to be reduced in thickness. For example, crystal silicon is used as the crystal membrane, the thickness thereof needs to be reduced to about 30 nm. The surface normal of the crystal membrane desirably coincides with the main direction of crystallographic axis so as to narrow the drive range of an angle adjustment mechanism for the crystal membrane. For example, when silicon crystal is used, the surface normal is preferably <100>, <110>or the like. This narrows the angle formed between a beam incident axis and the surface normal as an angle adjustment range for developing channeling to near 0 degrees. The crystal membrane is mounted to the multi-membrane holder 614, and the multi-membrane holder 614 is mounted on the multi-membrane system 610. The multi-membrane system 610 is disposed inside the vacuum chamber 604 as a part of the filter device 600 as illustrated.

(Porous Membrane)

Figure 14A:
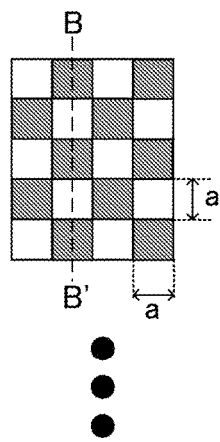
FIGS. 14A and 14B are schematic views each explaining the structure of a porous membrane.
Figure 14B:
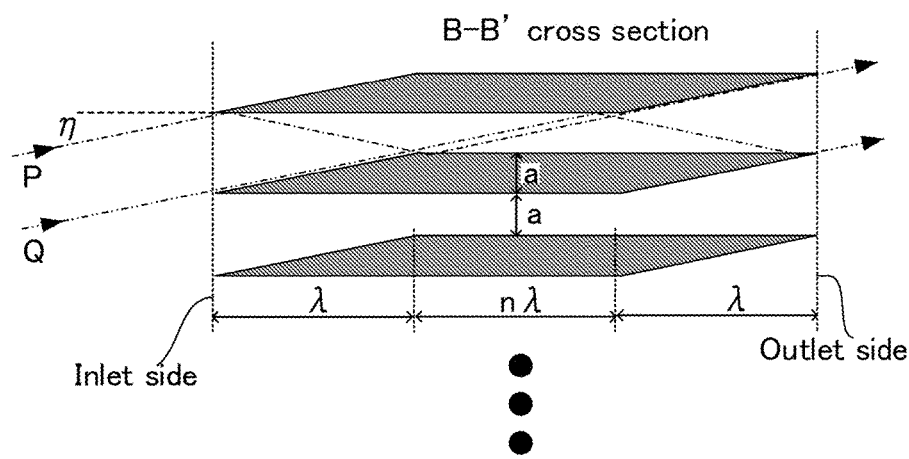

The porous membrane has durability against an ion beam and is thus preferable as the membrane used for the filter device 600 according to the present invention. FIGS. 14A and 14B are schematic views each explaining the structure of the porous membrane.

The porous membrane is a membrane in which holes of several microns are arranged. These holes each constitute the channel as the ion passage. In FIG. 14A, when viewing the membrane surface, the holes (blank parts) are each formed into a rectangular shape to form a checker flag pattern. A cross-sectional view taken along line B-B' is illustrated in FIG. 14B.

The membrane cross section has a wedge shape having an angel of η at the inlet and outlet-sides. When ions are incident from the left side in the drawing, they exit from the right side in the drawing after repeating flying in the channel and scattering at the wall surface of the channel. Such a situation is similar to the ion channeling of crystal and is called channeling-like effect (Hajnal, et al., Nucl. Inst. and Meth. B118 (1996) 617).

Particularly, when the cross section of the membrane is formed into a wedge as illustrated in FIG. 14B to allow the ions P and Q to be incident in parallel to each other at the same angle as the angle 11 of the wedge from the left side in the drawing, the ions each exit from the right side in the drawing at the same angle as the incident angle thereof after repeating scattering the same number of times at the upper and lower surfaces.

By setting the above situation, the effective porosity of the porous membrane increases to near 100%. Further, when the surface of the hole wall surface (surface of the inner space of the cavity formed in the porous membrane) is flat (specifically, the surface is flat at the scale (less than about several nm) of atomic size) at the atomic level, scattering at the wall surface becomes specular scattering due to surface channeling by making the incident angle less than a channeling critical angle.

This plays a role of enhancing the transmittance of the porous membrane. Actually, it is known that the surface channeling contributes to enhancement of the transmittance of the porous membrane (the above paper by Hajnal). Such oblique incidence leads to extension of an ion beam receiving area, thereby reducing heat flux. For example, the size of the porous membrane is set as follows. The critical angle for ions of 50 keV is about 3°, and the wedge angle is set to 2° in consideration of the divergence angle of the ion beam. When a pitch a of the holes in the porous membrane is 5 μm, a length λ of the wedge is 143 μm. Further, when the scattering frequency is two at the upper and lower surfaces, the membrane thickness is about 430 μm.

The above scattering frequency (two) is considered to be sufficient for maintaining the function of the filter device 600 according to the preset invention. The porous membrane can withstand a beam load, so that the necessity of the multi-membrane system is reduced, allowing the use of the single membrane system 320 described above. Thus, such a porous membrane is mounted to the single membrane holder 321, and the single membrane holder 321 is mounted on the main body of the single membrane system 320. The single membrane system 320 can be used as a part of the filter device 600 according to the present invention together with the vacuum chamber 604.

(Adjustment Method When Adopting Crystal Membrane)

The following describes an adjustment method for the filter device 600 when the crystal membrane and the multi-membrane system 610 are adopted in the filter device 600 according to the present invention.

As a first step, the multi-membrane holder 614 of the multi-membrane system 610 is accommodated in the vacuum chamber 604 with at least one frame 611 to which the crystal is not mounted being provided as a vacant frame. Further, the displacement mechanism control part 680 is used to position the Faraday cup 645 on the beam line through which the ion beam passes.

Subsequently, the multi-membrane holder 614 is rotated by the holder rotation control part 673 to position the vacant frame 611 on the beam line through which the ion beam passes. During this operation, generation of the ion beam is being stopped.

Subsequently, the ion beam is generated, and the generated ion beam is made to pass through the vacant frame 611. Then, the ion beam is captured by the Faraday cup 645 while the xy position of the first shaft 631 is adjusted by the xy adjustment mechanism control part 670, and current data corresponding to the captured ion beam is acquired by the current measuring part 655. The acquired current data is transmitted to and stored in the computing part 660. Then, the position of the first shaft 631 is fixed at a location at which the current data measured by the current measuring part 655 becomes maximum. After the position of the first shaft 631 is fixed, generation of the ion beam is temporarily stopped.

As a second step, the multi-membrane holder 614 is rotated by the holder rotation control part 673 to position the frame 611 to which the crystal 612 is mounted on the beam line through which the ion beam passes.

Subsequently, the ion beam is generated and made to pass through the crystal 612 mounted to the frame 611. Then, the ion beam is captured by the Faraday cup 645 while the first shaft 631 and the second shaft 632 are rotated in the θ-direction and w-direction by the first and second shaft rotation control parts 671 and 672, respectively. Then, current data corresponding to the captured ion beam is acquired by the current measuring part 655. The acquired current data is transmitted to and stored in the computing part 660. Then, the rotation positions of the first and second shafts 631 and 632 are fixed at respective positions at which the current data measured by the current measuring part 655 becomes maximum. After the rotation position of the first and second shafts 631 and 632 are fixed, generation of the ion beam is temporarily stopped. Thus, adjustment of the filter device 600 in the small AMS system 500 according to the present invention is completed.

In the present embodiment, the xy position of the frame 611 to which the crystal is not mounted is adjusted by xy movement of the first shaft 631 in the first step; however, when the xy position of the first shaft 631 is considered to coincide with the beam passing position, for example, when the current adjustment is started immediately after the previous adjustment, the xy position need not be performed.
(Adjustment Method When Adopting Porous Membrane)

The following describes an adjustment method for the filter device 600 when the porous membrane and the multi-membrane system 610 are adopted in the filter device 600 according to the present invention. This adjustment method is basically the same as that when the crystal membrane is adopted and differs therefrom in that the single membrane system can be used and in the operation of the second step.

In the filter device 600, when the porous membrane is used, the above-described single membrane system 320 can be used in place of the multi-membrane system 610. In this case, the single membrane positioning stage 322 of the single membrane system 320 is preferably provided with the xy adjustment mechanism for the first shaft 331 and its control part, rotation adjustment mechanism of the rotation angle θ of the first shaft 331 and its control part, and rotation adjustment mechanism of the rotation angle ω of the second shaft 332 and its control part so as to perform the same adjustment as that in the multi-membrane system 610. In the single-membrane system, as the hole to which the membrane is not mounted, which is used in the first step in the adjustment for the multi-membrane system, a bolt hole separated in the +y-direction from the center of the vacuum flange 12 can be used, for example. As described in the explanation of FIG. 8, the bolt hole is used to connect the single membrane system 320 and the gas ionization chamber by receiving a bolt therethrough. In the use in the filter device 600, the bolt is not inserted, and the bolt hole is vacant. When this bolt hole is not used, it is preferable to form a hole having a diameter almost equal to that of the hole for the porous membrane at a portion not obstructing drive adjustment.

In the second step, the first shaft 331 is pushed in the y-direction by a distance between the position of the bolt hole used in the first step and the center of the vacuum flange 12, i.e., by a hole position radius. As a result, the porous membrane mounted at the center of the flange 12 is positioned on the beam line. Then, the ion beam is generated and is made to pass through the hole.

In the following description of the adjustment method, a case is assumed where the porous membrane is disposed in the direction illustrated in FIG. 14B in the system in which the ion beam enters from the left as illustrated in FIG. 13. That is, the angle of the wedge of the channel wall cross section, i.e., a rotation axis with an angle η of a tapered opening illustrated in FIG. 14B and a rotation axis with an angle ω to illustrated in FIG. 13 are parallel to each other.

Then, the first shaft 631 is rotated in the θ by the first shaft rotation control part 671 to allow the Faraday cup 645 to capture the ion beam. Then, current data corresponding to the captured ion beam is acquired by the current measuring part 655. The current data is then transmitted to and stored in the computing part 660. Then, the θ rotation angle of the first shaft 631 is fixed at a position at which the current data measured by the current measuring part 655 becomes maximum.

The ω to rotation is controlled in the same manner as in the θ rotation. That is, the current data is acquired by the current measuring part 655 while the second shaft 632 is rotated in the ω-direction of FIG. 13 by the second shaft rotation control part 672. However, in the ω rotation, two main current peaks appear. That is, the first peak appears at a given angle ω, and the second peak appears after further rotation of the second shaft 632 by a given angle. This is due to a geometric effect of the "tapered opening of the channel wall cross section" provided at the ion inlet and outlet sides in the porous membrane cross section illustrated in FIG. 14B. By this effect, channeling-like effect in which the ions incident in parallel to the tapered surface as illustrated in FIG. 14B exit after being reflected at the channel wall surface is generated as illustrated in FIG. 14B and, at the same time, virtual aperture ratio increases, so that the number of passing ions increases to form the first peak. The second peak is resulting from incidence of the ions in parallel to the channel axis of a parallel channel having a width a inside the porous membrane and transmission thereof through the porous membrane substantially without contacting the wall surface. The angle difference that brings about the above two peaks coincides with the angle of the wedge of the channel wall cross section, i.e., the angle η of the tapered opening. In the arrangement of the porous membrane assumed above, the angle producing the first current peak is an angle that brings about the pseudo channeling to be generated, and thus the rotation angle of the second shaft 62 is fixed at this angle position. The magnitude of the peak current can exceed the magnitude of the second peak to be maximum when specular reflection occurs as the scattering at the channel wall surface due to the surface channeling. Thus, the adjustment of the filter device 600 in the small AMS system 500 according to the present invention when the porous membrane is used is completed.

Taking the above-described knowledge, it is defined that a case where the channel axis of the functional membrane for ion beam transmission (e.g., porous membrane) is adjusted to be substantially parallel to the travel direction of the ion beam is included in the category of the present invention.
(Verification Results of Separation of Isobar)

Figure 15A:
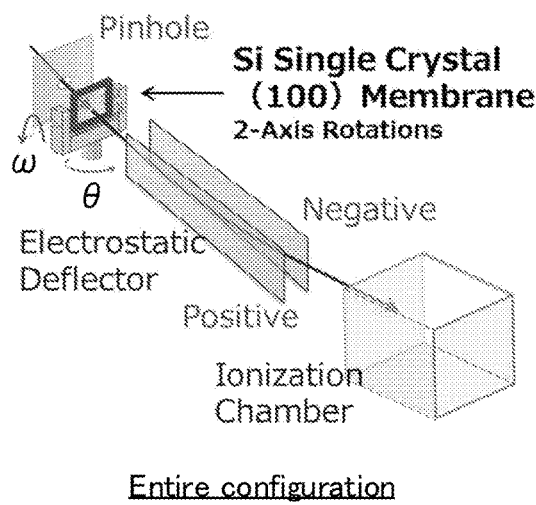
FIGS. 15A and 15B are views each illustrating a detailed configuration of an AMS nuclide detector 580.
Figure 15B:
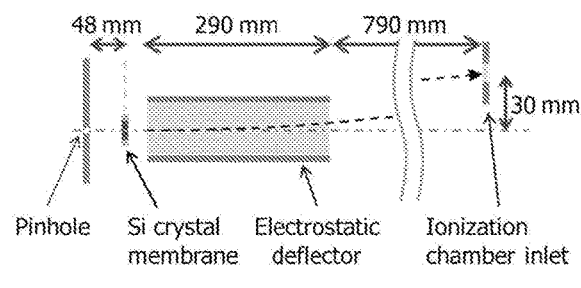
Figure 16A:
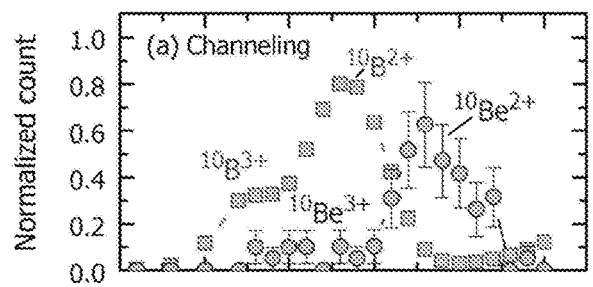
FIGS. 16A to 16C are views illustrating changes in normalized count with respect to voltage $V_D$ to an electrostatic deflector.
Figure 16B:
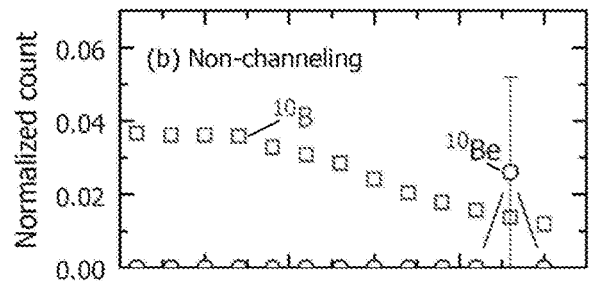
Figure 16C:
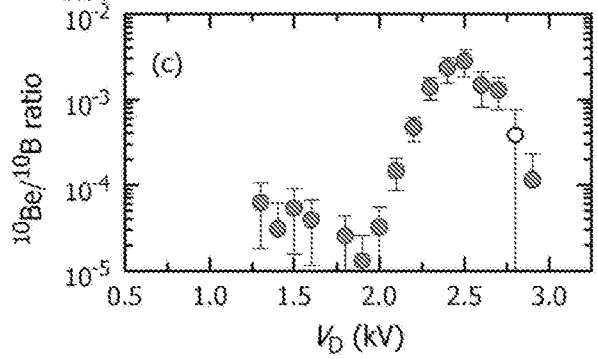

The following describes verification results of the present invention when the filter device 600 using the single membrane system 320 is applied to an AMS nuclide detector 580. FIGS. 15A and 15B are views each illustrating a detailed configuration of the AMS nuclide detector 580. FIGS. 16A to 16C are views illustrating a change in normalized count with respect to voltage $V_D$ to an electrostatic deflector.

In the AMS, when there exist stable isobars having a mass equal to the mass of the AMS nuclides ($^{10}$B for $^{10}$Be, $^{36}$S for $^{36}$Cl, $^{53}$Cr for $^{53}$Mn, etc.), they become nuclides (interference nuclides) interfering with the measurement of the AMS nuclides, and the separation of these interference nuclides (hereinafter, isobar separation) is the main technological issue.

A method using a degrader membrane is known as the above separation technology. The degrader membrane is generally installed between an analyzer magnet and an electrostatic deflector and produces a difference in energy between the AMS nuclide and the isobar based on dependency of stopping power on the atomic number to separate them. This method is effective when an absorber cannot be used due to low energy or when an isobar incidence rate is at the limit (exceeding about 5 kHz) of the gas ionization chamber.

Conventionally, an amorphous material (representatively, silicon nitride) has been used as the degrader membrane. In the filter device 600 according to the present invention, ion channeling by a single crystal membrane is used. The ion channeling has the following two advantages. The first one is suppression of beam divergence, and the second one is sufficient stopping power. By making use of the above advantages, it is possible to significantly enhance transmittance from the membrane to the AMS nuclide detector because of reduction in large-angle scattering by the channeling even when a membrane, which cannot conventionally be used, having a thickness of about 1 μm and capable of comparatively increasing a difference in energy between the AMS nuclides and the interference nuclides. Hereinafter, a case where the filter device 600 according to the present invention is applied to separation between $^{10}$Be and $^{10}$B will be described.

BeO—current entering the filter device 600 was 1 μA to 2 μA. The terminal voltage of the accelerator was set to 1.0 MV. In this case, energy $E_0$ of both $^{10}$Be$^{2+}$ and $^{10}$B$^{2+}$ was 2.44 MeV. The Si single crystal membrane had a (100) plane orientation. The size of the Si crystal membrane was 4.8 mm×4.8 mm, and the thickness thereof was 2 μm. Angle adjustment was performed using a double-axis rotation goniometer. The angle was defined such that a situation where an angle between the beam axis and the membrane at which <100> axis channeling can occur was θ=ω=0°. The non-channeling state of the Si single crystal membrane was defined as θ=8.5° and ω=5°. Table 2 shows results obtained in the present invention where the crystal membrane is put into the channeling state and results obtained in a comparative example where the crystal membrane is not put into the channeling state.

TABLE 2

| Crystal membrane type | Channeling state (preset invention) Si single crystal membrane with 2 μm thickness | Non-channeling state (comparative example) |
|---|---|---|
| $^{10}$Be/$^{10}$B ratio | $(3 \pm 1) \times 10^{-3}$ | $(4 \pm 4) \times 10^{-4}$ |
| Crystal membrane - gas ionization chamber transmittance | 26% | 1% |
| Energy separation ratio $[(E_{Be} - E_B)/E_0]$ | 12% | 16% |
| Isobar separation performance | 320 | 16 |

The divergence angle of the ion beam is limited to a value less than 0.06° (1 mrad) by a pinhole having an inner diameter of 1 mm. This angle is smaller than a critical angle (0.5°) of both $^{15}$Be$^{2+}$ and $^{10}$B$^{2+}$ at 2.44 MeV, so that most ions can assume a channeling behavior. The position of the gas ionization chamber was shifted by 30 mmm in the deflection direction from the center axis. As the gas ionization chamber incidence window, a $Si_3N_4$ membrane with a thickness of 50 nm was used. The incidence ratio $^{15}$Be/$^{15}$B into the Si membrane between $^{15}$Be and $^{15}$B was $7\times10^{-5}$.

A change in normalized count with respect to voltage $V_D$ to an electrostatic deflector is illustrated in FIG. 16. In the channeling state of FIG. 16A, charge state distribution appears clearly. Particularly, at $V_D$=2.5 kV, reduction in $^{10}$B and increase in $^{10}$Be occur. In the non-channeling state of FIG. 16B, charge state distribution does not appear clearly. FIG. 16C illustrates $V_D$ dependency of $^{10}$Be/$^{10}$B ratio. In the channeling state, the $^0$Be/$^{10}$B ratio reaches up to $3\times10^{-3}$ at VD=2.5 kV. This value is larger by one digit than that in the non-channeling state. The above results are brought about by the above two expected effects.

Isobar separation performance comparison is shown in Table 2. Transmittance from the single crystal membrane to the gas ionization chamber is higher by one digit in the channeling state than in the non-channeling state. The difference in energy separation ratio between the channeling state and the non-channeling state is small. When a product of the transmittance and the energy separation ratio is set as the isobar separation performance, the value thereof is significantly larger in the channeling state than in the non-channeling state. Thus, the superiority of the filter device 600 according to the present invention using the channeling is demonstrated.

Thus, in the functional membrane for ion beam transmission according to the present invention, the beam line device using the functional membrane for ion beam transmission, the filter device using the functional membrane for ion beam transmission and the method of adjusting the filter device, the channel axis in the functional membrane for ion beam transmission is adjusted so as to be substantially parallel to the travel direction of the ion beam, making it possible to enhance transmittance of the ion beam and to improve emittance.

INDUSTRIAL APPLICABILITY

In beam line devices and the like, development of a functional membrane for ion beam transmission having high ion beam transmittance has conventionally been required; however, such a functional membrane for ion beam transmission has not yet been developed, which hinders device miniaturization. The functional membrane for ion beam transmission according to the present invention is used in a beam line device through which an ion beam traveling in one direction passes and has a channel. The axis of the channel is substantially parallel to the travel direction of the ion beam, so that it is possible to enhance ion beam transmittance and to improve emittance, and thus industrial applicability is high.

REFERENCE SIGNS LIST

3: Beam converging lens
4: Vacuum chamber
5: Terminal
10: Tandem accelerator
11: Stripper
12: Vacuum flange
30: Post stripper
50: Degrader
70: Gas ionization chamber
71: Degrader window
210: Multi-membrane system
211: Frame
212: Membrane
213: Membrane assembly
214: Multi-membrane holder
215: Multi-membrane positioning stage
230: Base part
231: First shaft
232: Second shaft
235: Frame body
320: Single membrane system
321: Single membrane holder
322: Single membrane positioning stage
330: Base part 331: First shaft
332: Second shaft
335: Frame body
500: Small AMS system
510: Negative ion source
520: Incident electromagnet
560: Analyzer magnet
565: Stable nuclide detector
570: Energy analyzer
580: AMS nuclide detector
600: Filter device
604: Vacuum chamber
610: Multi-membrane system
611: Frame
612: Membrane
613: Membrane assembly
614: Multi-membrane holder
615: Multi-membrane positioning stage
630: Base part
631: First shaft
632: Second shaft
635: Frame body
640: Base part
645: Faraday cup
646: Faraday cup support member
650: Filter device controller
655: Current measuring part
660: Computing part
670: Xy adjustment mechanism control part
671: First shaft rotation control part
672: Second shaft rotation control part
673: Holder rotation control part
680: Displacement mechanism control part

The invention claimed is:

1. A functional membrane for ion beam transmission used in a beam line device through which an ion beam traveling in one direction passes, the functional membrane comprising a plurality of channels,
wherein the functional membrane is made of crystal,
wherein the functional membrane has a thickness sufficient for charge state distribution of incident ion to maintain an equilibrium state,
wherein channel axes of the plurality of channels are substantially parallel to a travel direction of the ion beam, and the plurality of channels extend along a crystallographic axis of the crystal, so as to place the functional membrane in an ion channeling state.

2. The functional membrane for ion beam transmission according to claim 1, wherein the functional membrane is made of a porous substance in which cavities are formed.

3. A beam line device comprising:
a vacuum chamber in which an ion beam passes;
a functional membrane for ion beam transmission a plurality of channels, the functional membrane having a thickness sufficient for charge state distribution of incident ion to maintain an equilibrium state, and the functional membrane being disposed in the vacuum chamber; and
a positioning stage attached with the functional membrane and configured to adjust a position of the functional membrane,
wherein
the functional membrane is made of crystal,
the plurality of channels extend along a crystallographic axis of the crystal, and
the positioning stage is configured to adjust the position of the functional membrane such that the functional membrane is disposed in the beam line of the ion beam and channel axes of the plurality of channels of the functional membrane are substantially parallel to the traveling direction of the ion beam, so as to place the functional membrane in an ion channeling state.

4. The beam line device according to claim 3, wherein:
the crystal is a single crystal.

5. The beam line device according to claim 3, wherein:
the functional membrane is a thin film made of a porous substance in which cavities are formed.

6. The beam line device according to claim 3, wherein the beam line device is an accelerator.

7. The beam line device according to claim 3, wherein the beam line device is a stripper.

8. The beam line device according to claim 3, wherein the beam line device is a degrader.

9. The beam line device according to claim 3, wherein the beam line device is a gas ionization chamber.

10. A filter device that removes an unwanted particle contained in an ion beam traveling in a vacuum chamber, the filter device comprising:
a vacuum chamber in which an ion beam passes;
a functional membrane for ion beam transmission comprising a plurality of channels, the functional membrane having a thickness sufficient for charge state distribution of incident ion to maintain an equilibrium state, and the functional membrane being disposed in the vacuum chamber; and
a positioning stage attached with the functional membrane and configured to adjust a position of the functional membrane,
wherein
the functional membrane is made of crystal,
the plurality of channels extend along a crystallographic axis of the crystal, and
the positioning stage is configured to adjust the position of the functional membrane such that the functional membrane is disposed in the beam line of the ion beam and that channel axes of the plurality of channels of the functional membrane are substantially parallel to a traveling direction of the ion beam, so as to place the functional membrane in an ion channeling state.

11. The filter device according to claim 10, wherein:
the crystal is a single crystal.

12. The filter device according to claim 10, wherein:
the functional membrane for ion beam transmission is a thin film made of a porous substance in which cavities are formed.

13. A method for adjusting a filter device including:
a vacuum chamber in which an ion beam passes;
a functional membrane for ion beam transmission disposed in the vacuum chamber, the functional membrane comprising a plurality of channels, the functional membrane being made of crystal, and the plurality of channels extending along a crystallographic axis of the crystal;
a positioning stage attached with the functional membrane and configured to adjust a position of the functional membrane;
a Faraday cup disposed downstream of the positioning stage and configured to capture the ion beam; and
a current measuring part that measures current based on the ion beam captured by the Faraday cup,
the method comprising:
a step of adjusting the position of the positioning stage such that the functional membrane is disposed in a beam line, so that channel axes of the plurality of channels of the functional membrane are substantially parallel to a travel direction of the ion beam to place the functional membrane in an ion channeling state and that the current measured by the current measuring part becomes maximum.

14. A method for adjusting a filter device including:
a vacuum chamber in which an ion beam passes;
a functional membrane for ion beam transmission having a channel and disposed in the vacuum chamber;
a positioning stage attached with the functional membrane for ion beam transmission and configured to adjust a position of the functional membrane for ion beam transmission;
a Faraday cup disposed downstream of the positioning stage and configured to capture the ion beam; and
a current measuring part that measures current based on the ion beam captured by the Faraday cup,
the method comprising:
　a first step of adjusting the position of the positioning stage such that the ion beam passes through a position at which the functional membrane for ion beam transmission is absent and that the current measured by the current measuring part becomes maximum; and
　a second step of adjusting, after the first step, the position of the positioning stage such that the functional membrane for ion beam transmission is disposed in a beam line and that the current measured by the current measuring part becomes maximum.

15. The filter device adjustment method according to claim 14, comprising, after the second step, a third step of making the Faraday cup depart from the beam line.

* * * * *